US011387233B2

(12) United States Patent
Su et al.

(10) Patent No.: US 11,387,233 B2
(45) Date of Patent: Jul. 12, 2022

(54) SEMICONDUCTOR DEVICE STRUCTURE AND METHODS OF FORMING THE SAME

(71) Applicant: TAIWAN SEMICONDUCTOR MANUFACTURING CO., LTD., Hsinchu (TW)

(72) Inventors: Huan-Chieh Su, Changhua County (TW); Chun-Yuan Chen, Hsinchu (TW); Pei-Yu Wang, Hsinchu (TW); Cheng-Chi Chuang, New Taipei (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/915,930

(22) Filed: Jun. 29, 2020

(65) Prior Publication Data
US 2021/0407994 A1 Dec. 30, 2021

(51) Int. Cl.
| | |
|---|---|
| *H01L 29/08* | (2006.01) |
| *H01L 27/088* | (2006.01) |
| *H01L 21/762* | (2006.01) |
| *H01L 21/8234* | (2006.01) |
| *H01L 29/06* | (2006.01) |
| *H01L 29/66* | (2006.01) |
| *H01L 29/78* | (2006.01) |

(Continued)

(52) U.S. Cl.
CPC ........ *H01L 27/0886* (2013.01); *H01L 21/762* (2013.01); *H01L 21/823431* (2013.01); *H01L 21/823443* (2013.01); *H01L 21/823475* (2013.01); *H01L 29/0649* (2013.01); *H01L 29/0847* (2013.01); *H01L 29/66795* (2013.01); *H01L 29/7851* (2013.01); *H01L 23/5286* (2013.01); *H01L 23/53204* (2013.01)

(58) Field of Classification Search
CPC ......... H01L 29/06; H01L 29/08; H01L 29/66; H01L 29/78; H01L 29/0649; H01L 29/0847; H01L 29/7851; H01L 29/66795; H01L 23/528; H01L 23/532; H01L 23/8286; H01L 23/53204; H01L 27/088; H01L 27/0886; H01L 21/762; H01L 21/8234; H01L 21/823431; H01L 21/823443; H01L 21/803475; H01L 21/823437; H01L 21/823481; H01L 29/785; H01L 29/4238; H01L 29/423
USPC ....................................................... 257/368
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |

(Continued)

*Primary Examiner* — Chuong A Luu
(74) *Attorney, Agent, or Firm* — NZ Carr Law Office

(57) ABSTRACT

A semiconductor device structure, along with methods of forming such, are described. The structure includes a source region, a drain region, and a gate electrode layer disposed between the source region and the drain region. The gate electrode layer includes a first surface facing the source region, and the first surface includes an edge portion having a first height. The gate electrode layer further includes a second surface opposite the first surface and facing the drain region. The second surface includes an edge portion having a second height. The second height is different from the first height.

20 Claims, 28 Drawing Sheets

(51) Int. Cl.
    *H01L 23/528*     (2006.01)
    *H01L 23/532*     (2006.01)

(56) References Cited

U.S. PATENT DOCUMENTS

| | | |
|---|---|---|
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2003/0089932 A1* | 5/2003 | Iwata .................. H01L 29/7834 257/288 |
| 2017/0309569 A1* | 10/2017 | Azmat .................. H01L 29/161 |
| 2019/0148551 A1* | 5/2019 | More .............. H01L 21/823864 257/192 |

* cited by examiner

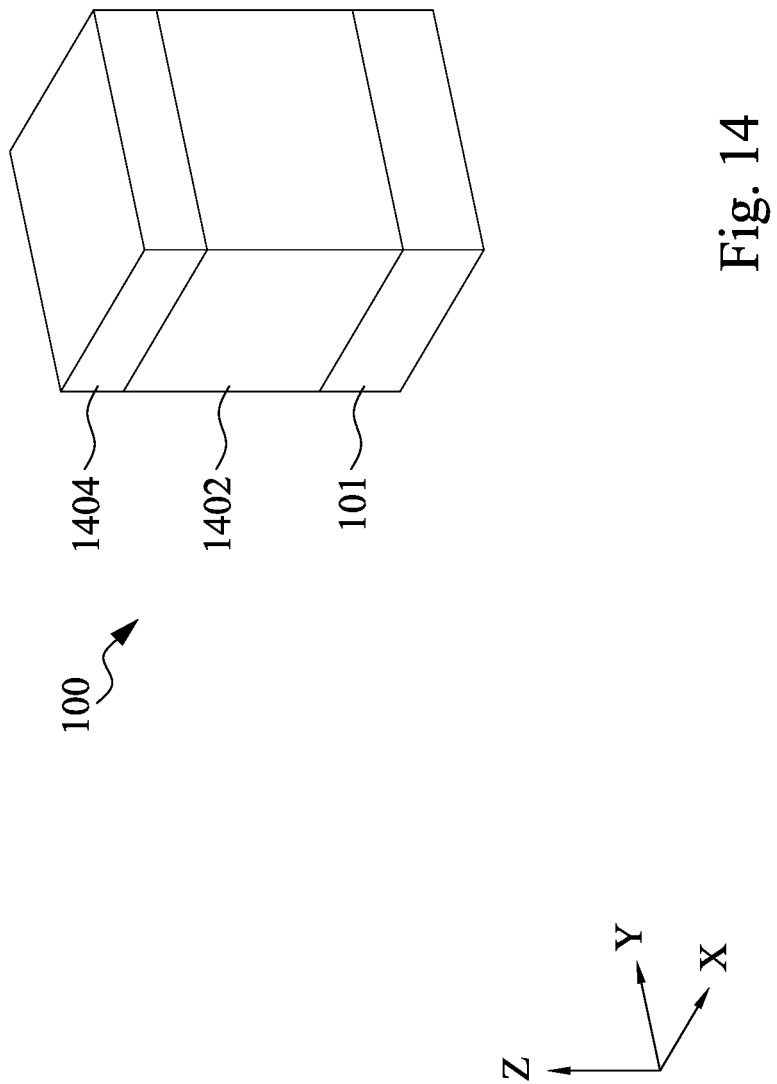

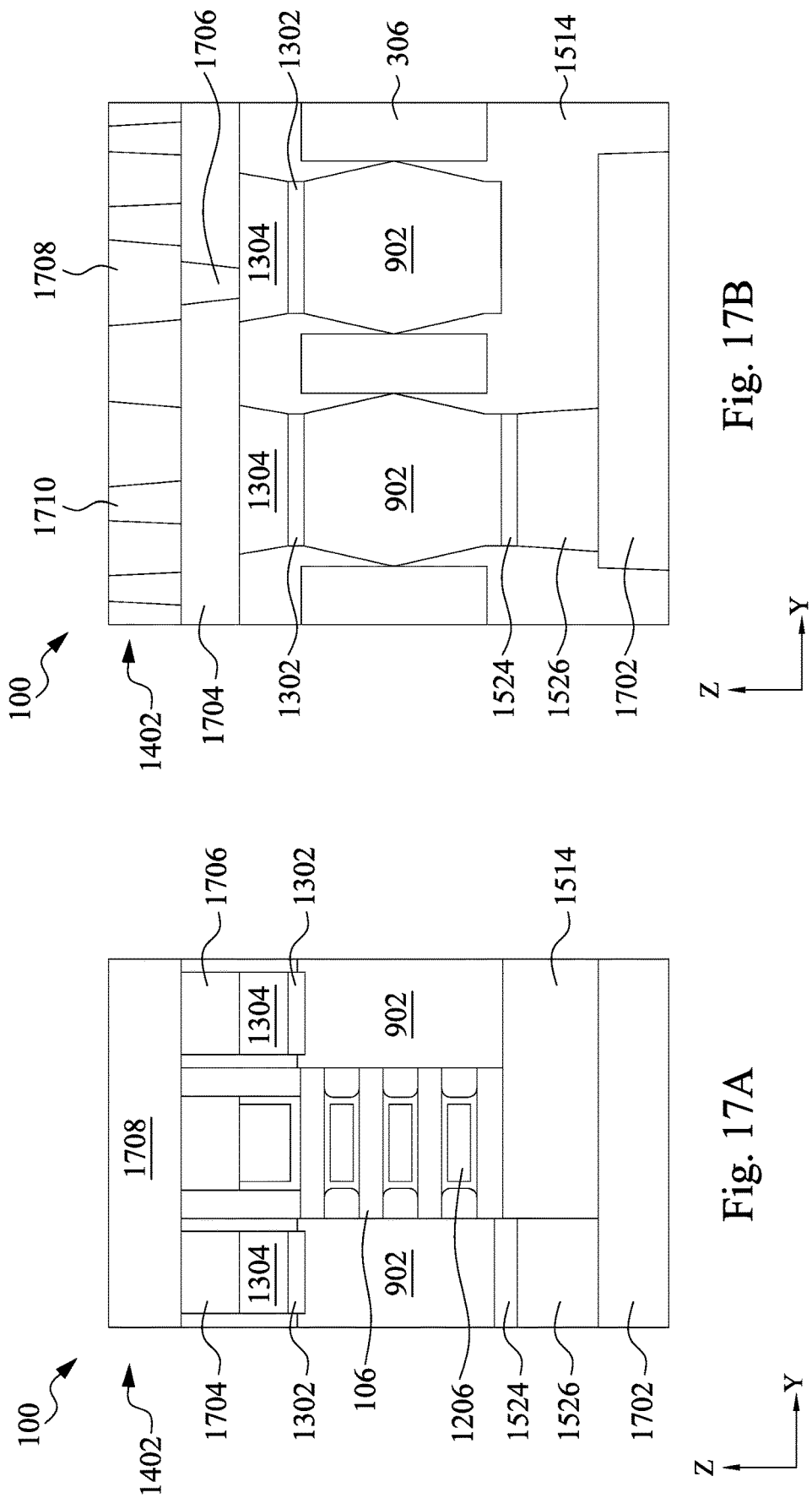

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 14 is a perspective view of the semiconductor device structure at a manufacturing stage, in accordance with some embodiments.

FIGS. 17A-17B are cross-sectional side views of the semiconductor device structure, in accordance with some embodiments.

DETAILED DESCRIPTION

Figure 1:
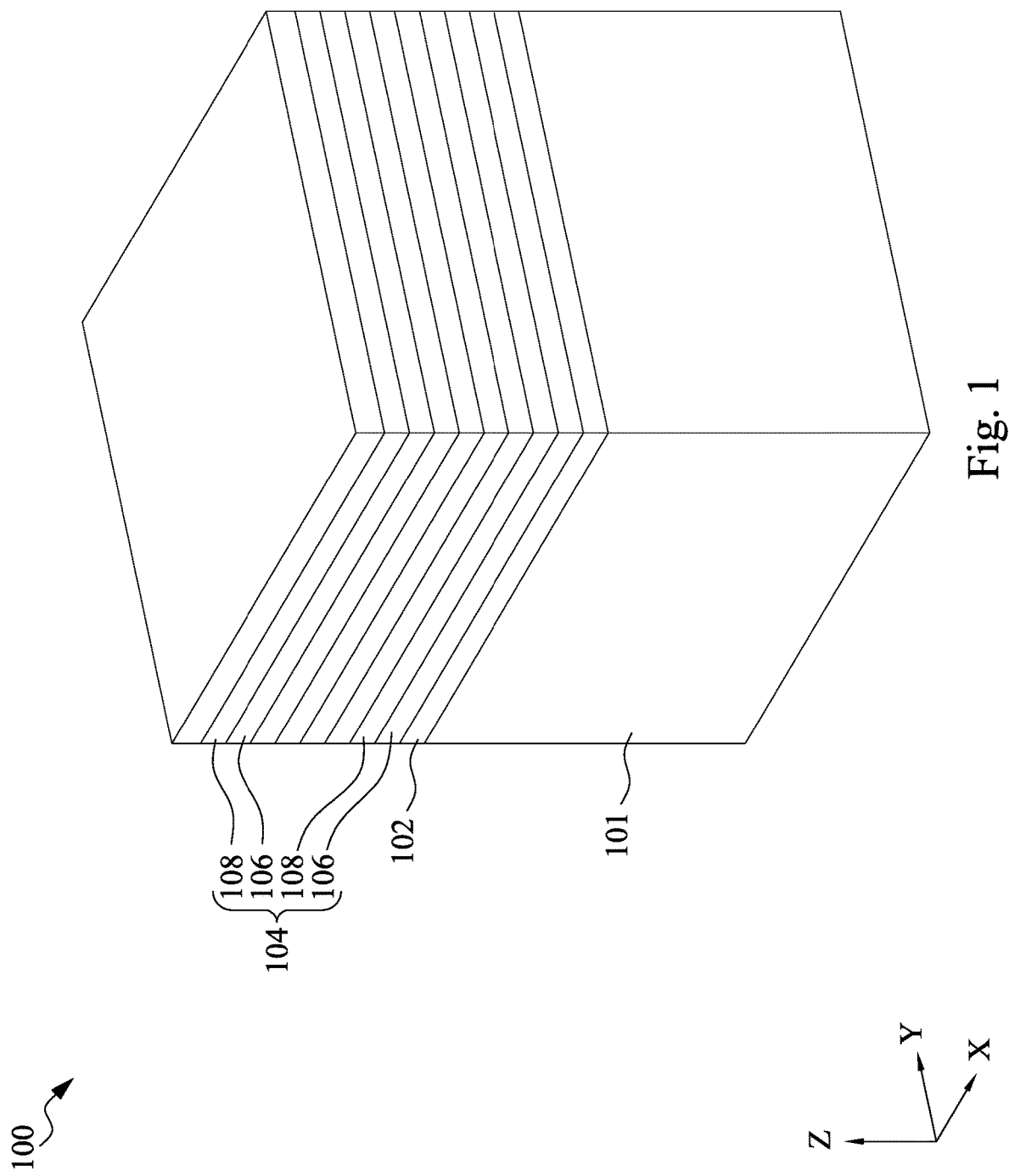
FIG. 1 is a perspective view of one of the various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-17B show exemplary sequential processes for manufacturing a semiconductor device structure 100, in accordance with some embodiments. It is understood that additional operations can be provided before, during, and after processes shown by FIGS. 1-17B, and some of the operations described below can be replaced or eliminated, for additional embodiments of the method. The order of the operations/processes may be interchangeable.

As shown in FIG. 1, a semiconductor layer 102 is formed on a substrate 101, and a stack of semiconductor layers 104 is formed on the semiconductor layer 102. The substrate 101 may be a semiconductor substrate. In some embodiments, the substrate 101 includes a single crystalline semiconductor layer on at least the surface of the substrate 101. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate 101 is made of Si. In some embodiments, the substrate 101 is a silicon-on-insulator (SOI) substrate, which includes an insulating layer disposed between two silicon layers. In one aspect, the insulating layer is an oxide.

The substrate 101 may include one or more buffer layers (not shown) on the surface of the substrate 101. The buffer layers can serve to gradually change the lattice constant from that of the substrate to that of the source/drain regions.

The buffer layers may be formed from epitaxially grown single crystalline semiconductor materials such as, but not limited to Si, Ge, germanium tin (GeSn), SiGe, GaAs, InSb, GaP, GaSb, InAlAs, InGaAs, GaSbP, GaAsSb, GaN, GaP, and InP. In one embodiment, the substrate 101 includes SiGe buffer layers epitaxially grown on the silicon substrate 101. The germanium concentration of the SiGe buffer layers may increase from 30 atomic percent germanium for the bottom-most buffer layer to 70 atomic percent germanium for the top-most buffer layer.

The substrate 101 may include various regions that have been suitably doped with impurities (e.g., p-type or n-type conductivity). The dopants are, for example boron for an n-type fin field effect transistor (FinFET) and phosphorus for a p-type FinFET.

The stack of semiconductor layers 104 includes first semiconductor layers 106 and second semiconductor layers 108. The first semiconductor layers 106 and the second semiconductor layers 108 are made of semiconductor materials having different etch selectivity and/or oxidation rates. For example, the first semiconductor layers 106 are made of Si and the second semiconductor layers 108 are made of SiGe. In some embodiments, the stack of semiconductor layers 104 includes alternating first and second semiconductor layers 106, 108. The first semiconductor layers 106 or portions thereof may form nanosheet channel(s) of the semiconductor device structure 100. The semiconductor device structure 100 may include a nanosheet transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The nanosheet channel(s) of the semiconductor device structure 100 may be surrounded by the gate electrode. The nanosheet transistors may be referred to as nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below. In some embodiments, the first and second semiconductor layers 106, 108 are replaced with a single semiconductor material disposed on the semiconductor layer 102, and the device is a FinFET.

It is noted that 5 layers of the first semiconductor layers 106 and 4 layers of the second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104; the number of layers depending on the predetermined number of channels for the semiconductor device structure 100. In some embodiments, the number of first semiconductor layers 106, which is the number of channels, is between 3 and 8.

As described in more detail below, the first semiconductor layers 106 may serve as channels for the semiconductor device structure 100 and the thickness is chosen based on device performance considerations. In some embodiments, each first semiconductor layer 106 has a thickness ranging from about 6 nanometers (nm) to about 12 nm. The second semiconductor layers 108 may eventually be removed and serve to define a vertical distance between adjacent channels for the semiconductor device structure 100 and the thickness is chosen based on device performance considerations. In some embodiments, each second semiconductor layer 108 has a thickness ranging from about 2 nm to about 6 nm.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

The semiconductor layer 102 is made of a semiconductor material having different etch selectivity than the first and second semiconductor layers 106, 108. In some embodiments, the second semiconductor layer 108 is made of SiGe having a first atomic percent germanium, and the semiconductor layer 102 is made of SiGe having a second atomic percent germanium greater than the first atomic percent germanium. As a result, the semiconductor layer 102 is etched at a faster rate than the second semiconductor layer 108 during an etch process. The semiconductor layer 102 may eventually be removed and replaced with an etch stop layer, which is further discussed below. The thickness of the semiconductor layer 102 may range from about 5 nm to about 30 nm.

Figure 2:
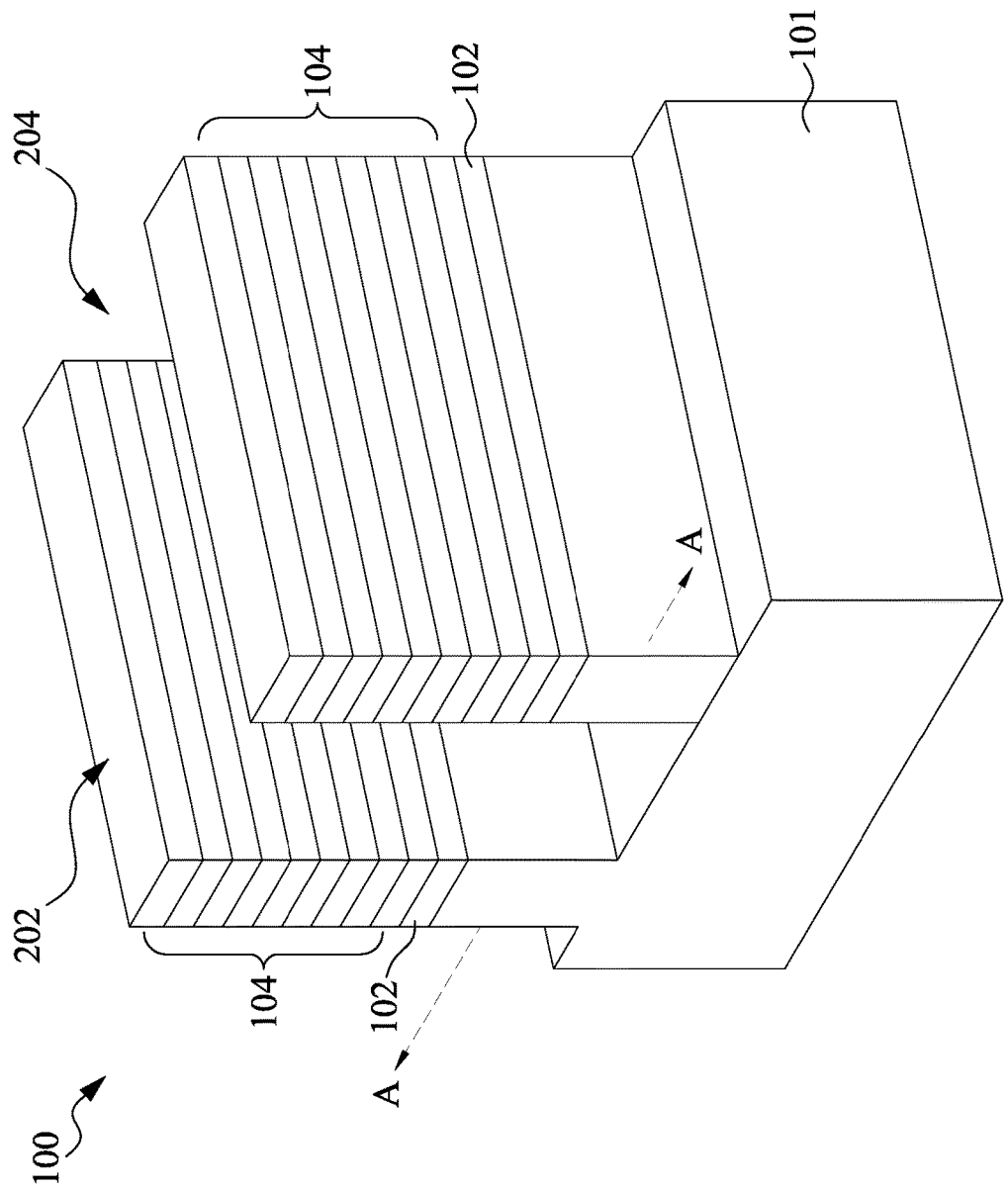
FIG. 2 is a perspective view of one of the various stages of manufacturing the semiconductor device structure, in accordance with some embodiments.

FIG. 2 is a perspective view of one of the various stages of manufacturing the semiconductor device structure 100, in accordance with some embodiments. As shown in FIG. 2, a plurality of fins 202 is formed. In some embodiments, each fin 202 includes a substrate portion formed from the substrate 101, a portion of the semiconductor layer 102, and a portion of the stack of semiconductor layers 104. The fins 202 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 202 by etching the stack of semiconductor layers 104. The etching process can include dry etching, wet etching, reactive ion etching (RIE), and/or other suitable processes.

In some embodiments, a hard mask (HM) layer (not shown) is formed over the stack of semiconductor layers 104 prior to patterning the fins 202. The fins 202 may subsequently be fabricated using suitable processes including photolithography and etch processes. The photolithography process may include forming a photoresist layer (not shown) over the HM layer, exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 101, and layers formed thereupon, while an etch process forms trenches 204 in unprotected regions through the HM layer, through the stack of semiconductor layers 104, the semiconductor layer 102, and into the substrate 101, thereby leaving the plurality of extending fins 202. The trenches 204 may be etched using a dry etch (e.g., RIE), a wet etch, and/or combination thereof.

Figure 3B:
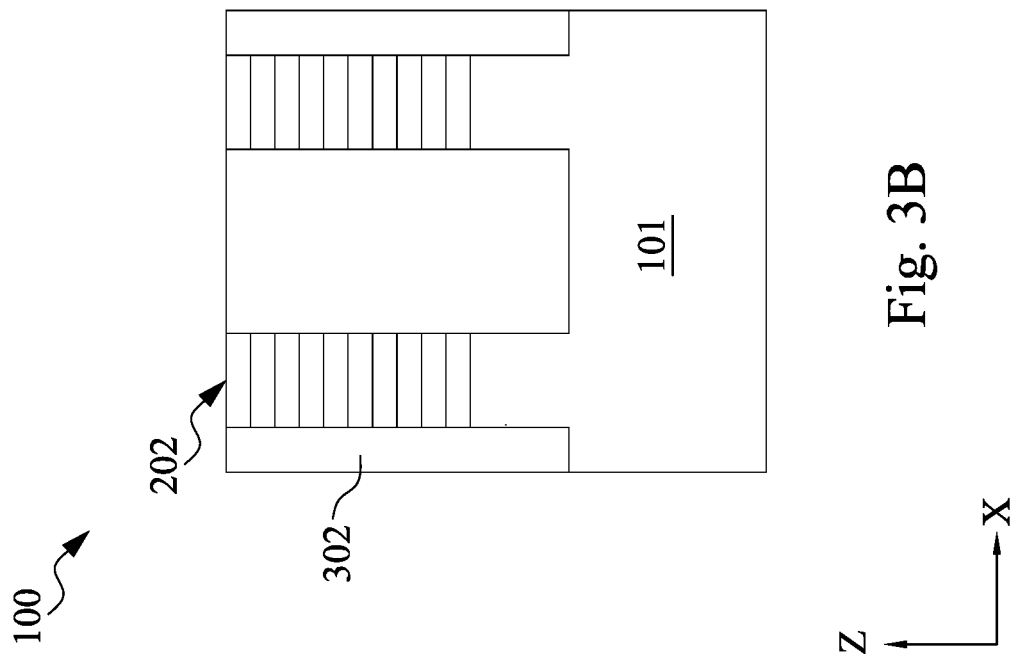
FIGS. 3A-3E are cross-sectional side views of various stages of manufacturing the semiconductor device structure taken along line A-A of FIG. 2, in accordance with some embodiments.
Figure 3A:
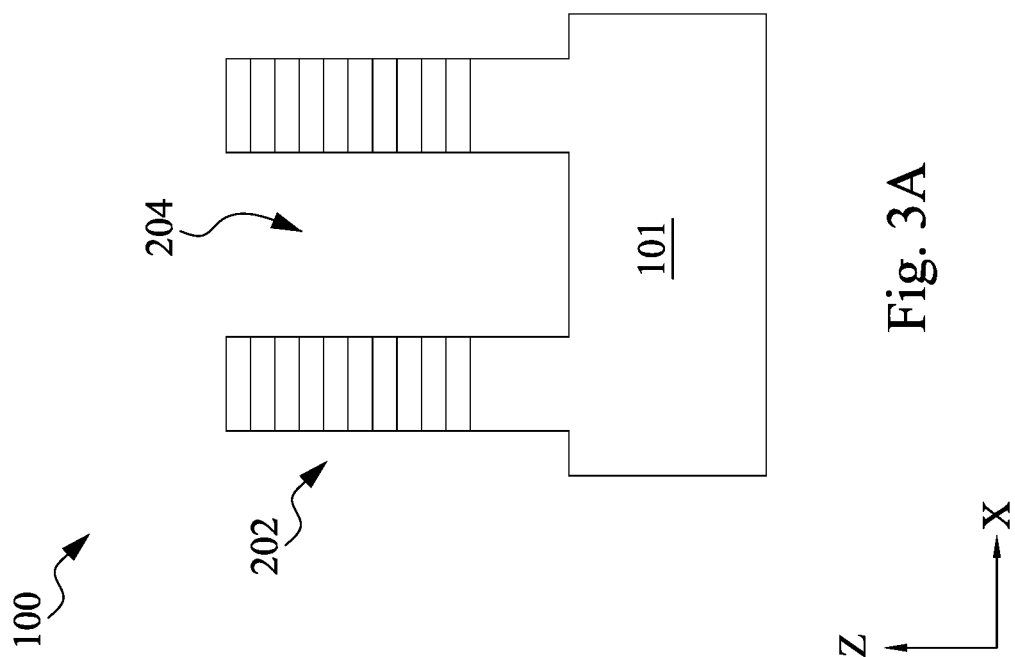

FIGS. 3A-3E are cross-sectional side views of various stages of manufacturing the semiconductor device structure 100 taken along line A-A of FIG. 2, in accordance with some embodiments. FIG. 3A is a cross-sectional side view of the semiconductor device structure 100 taken along line A-A of FIG. 2. As shown in FIG. 3B, after the fins 202 are formed, an insulating material 302 is formed over the substrate so that the fins 202 are embedded in the insulating material 302. Then, a planarization operation, such as a chemical mechanical polishing (CMP) method and/or an etch-back method, is performed such that the top of the fin 202 is exposed from the insulating material 302, as shown in FIG. 3B. The insulating material 302 may be made of silicon oxide, silicon nitride, silicon oxynitride (SiON), SiOCN, SiCN, fluorine-doped silicate glass (FSG), a low-K dielectric material, or any suitable dielectric material. The insulating material 302 may be formed by any suitable method, such as low-pressure chemical vapor deposition (LPCVD), plasma enhanced CVD (PECVD) or flowable CVD (FCVD).

Figure 3C:
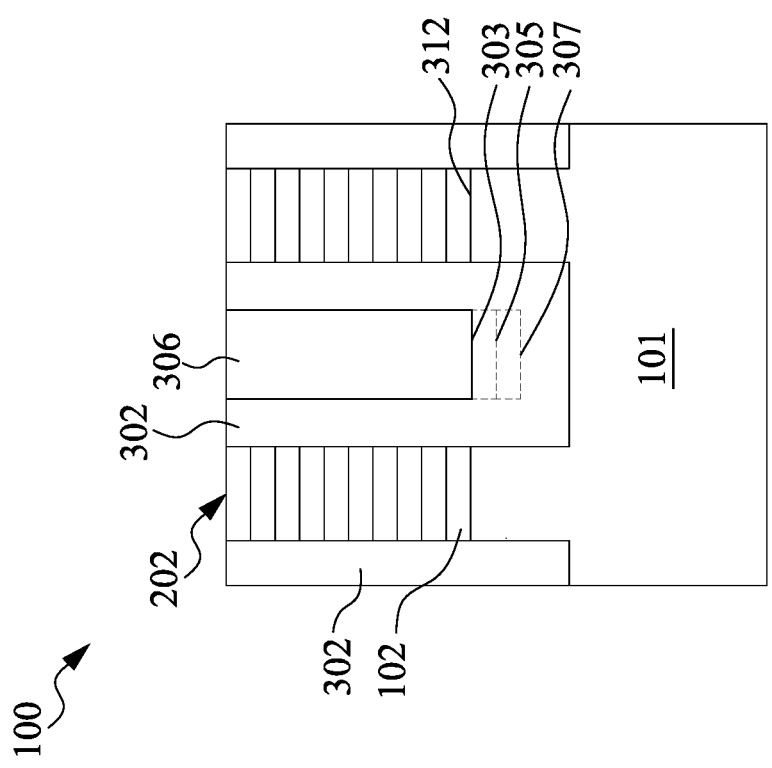

In some embodiments, a liner (not shown) is conformally formed on the fins 202 before forming the insulating material 302. The liner may be made of SiN or a silicon nitride-based material (e.g., SiON, SiCN or SiOCN). Next, as shown in FIG. 3C, a portion of the insulating material 302 located between adjacent fins 202 is removed, forming a trench 304. The trench 304 may be formed by patterning the insulating material 302 and removing the portion of the insulating material 302 by any suitable removal process, such as dry etching. In one embodiment, the trench 304 may have a bottom 303 extending to a location below a bottom surface 312 of the semiconductor layer 102 by a first distance. In another embodiment, the trench 304 may have a bottom 305 extending below the bottom surface 312 of the semiconductor layer 102 by a second distance greater than the first distance. In yet another embodiment, the trench 304 may have a bottom 307 extending below the bottom surface 312 of the semiconductor layer 102 by a third distance greater than the second distance. In some embodiments, all of the insulating material 302 located between adjacent fins 202 are removed, and the substrate 101 is exposed through the trench 304.

Figure 3D:
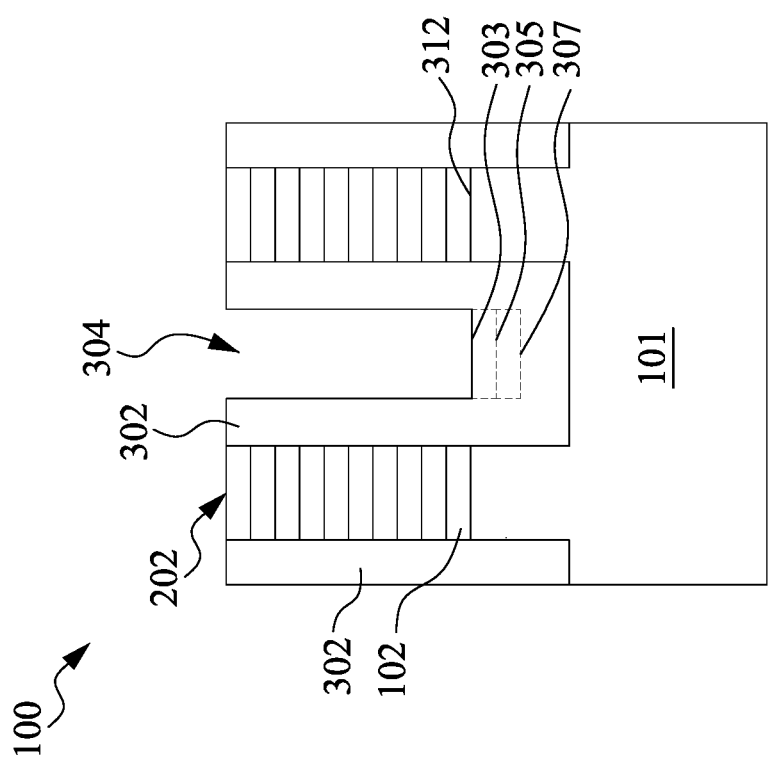
Figure 15A:
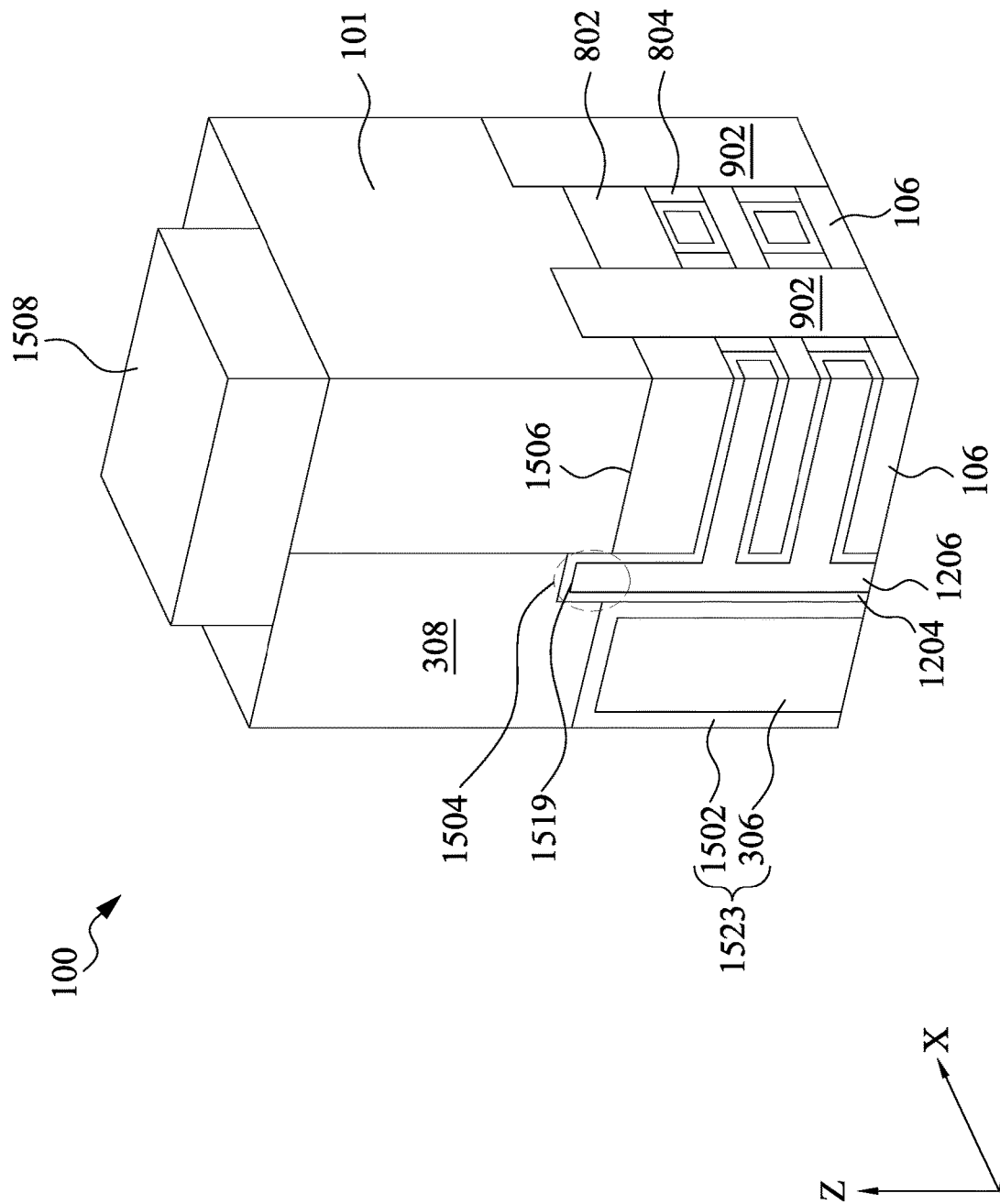
FIGS. 15A-15H are perspective views of various stages of manufacturing the semiconductor device structure, in accordance with some embodiments.
Figure 16A:
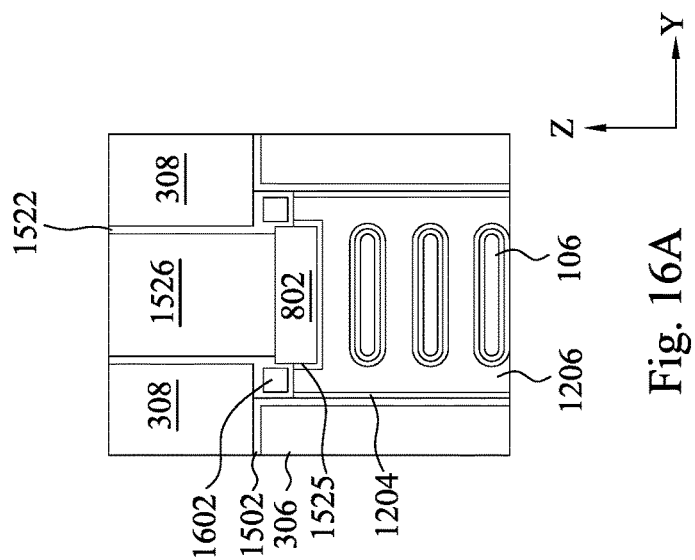
FIGS. 16A-16C are cross-sectional side views of a portion of the gate electrode layer and a conductive feature of FIG. 15H, in accordance with some embodiments.
Figure 16B:
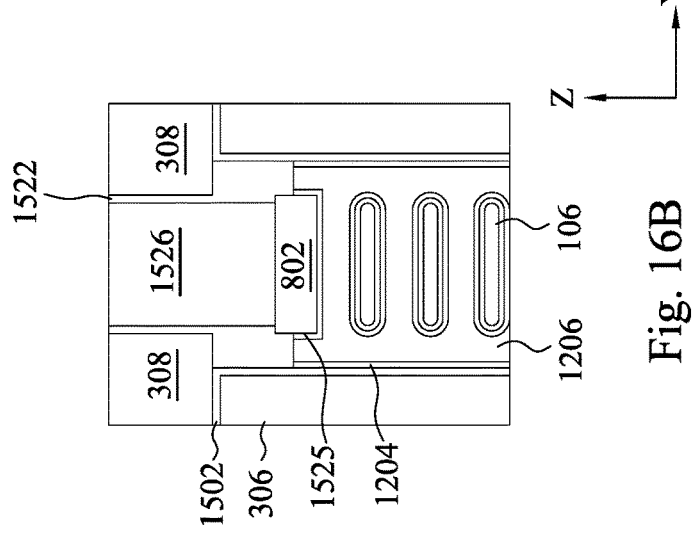
Figure 16C:
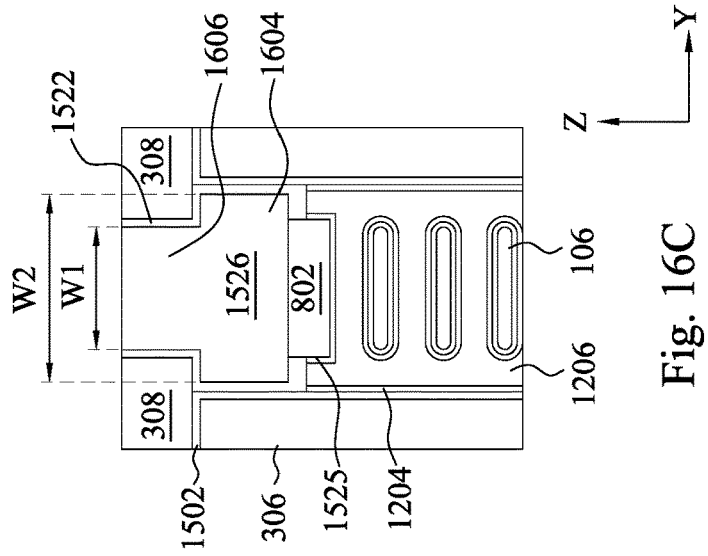

A dielectric feature 306 is formed in the trench 304, as shown in FIG. 3D. A liner (not shown) may be first conformally deposited in the trench 304, and the dielectric feature 306 is formed on the liner in the trench 304. In some embodiments, the dielectric feature 306 is made of a high-K dielectric material (e.g., a material having a K value higher than 7), such as $HfO_2$, $ZrO_2$, $HfAlO_x$, $HfSiO_x$, or $Al_2O_3$, or a low-K dielectric material (e.g., a material having a K value lower than 7), such as SiCN, SiOC, or SiOCN. In some embodiments, the dielectric feature 306 is made of more than one dielectric material. For example, a lower portion of the dielectric feature 306 may be made of the low-K dielectric material, and an upper portion of the dielectric feature 306 may be made of the high-K dielectric material. The dielectric feature 306 may be formed by any suitable method, such as CVD, PECVD, FCVD, physical vapor deposition (PVD), or atomic layer deposition (ALD). The dielectric feature 306 may extend to the bottom 303 of the trench 304. In some cases, the dielectric feature 306 may extend to the bottom 305 or 307 if a deeper trench 304 was adapted. The resulting structures of the dielectric feature 306 having various lengths are shown in FIGS. 16A, 16B and 16C. A CMP or an etch back process may be performed to remove any materials formed on the insulating material 302 and the fins 202. In some embodiments, the dielectric feature 306 is separated from the fins 202 by the insulating material 302. In some embodiments, the dielectric feature 306 is separated from the fins by a liner (not shown), such as the liner 1502 (FIG. 15A), and the dielectric feature 306 and the liner 1502 may be referred to as a hybrid fin 1523 (FIG. 15A). The hybrid fin 1523 may isolate functional fins, such as fins 202.

Figure 3E:
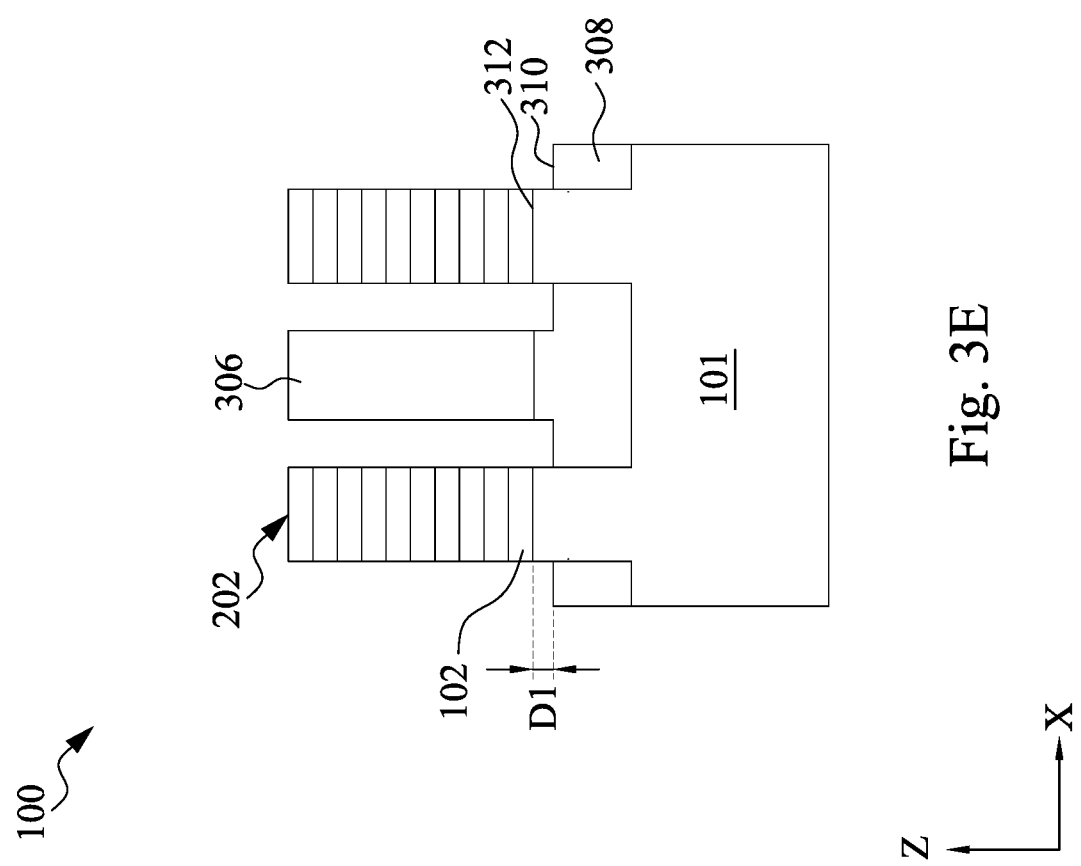

Next, as shown in FIG. 3E, the insulating material 302 is recessed to form an isolation region 308. The isolation region 308 may be the shallow trench isolation (STI). The recessing process may include a dry etching process, a wet etching process, or a combination thereof. The recess of the insulating material 302 exposes the semiconductor layer 102. The isolation region 308 adjacent the fin 202 has a top surface 310. The semiconductor layer 102 has the bottom surface 312. In order to ensure the semiconductor layer 102 is exposed, the top surface 310 of the isolation region 308 is spaced apart from a plane defined by the bottom surface 312 of the semiconductor layer 102 by a distance D1. The distance D1 may range from about few angstroms to 10 nm. In some embodiments where the dielectric features 306 are not formed, the insulating material 302 can be recessed after forming the insulating material 302. In other words, the processes performed shown in FIGS. 3C and 3D are omitted.

Figure 4:
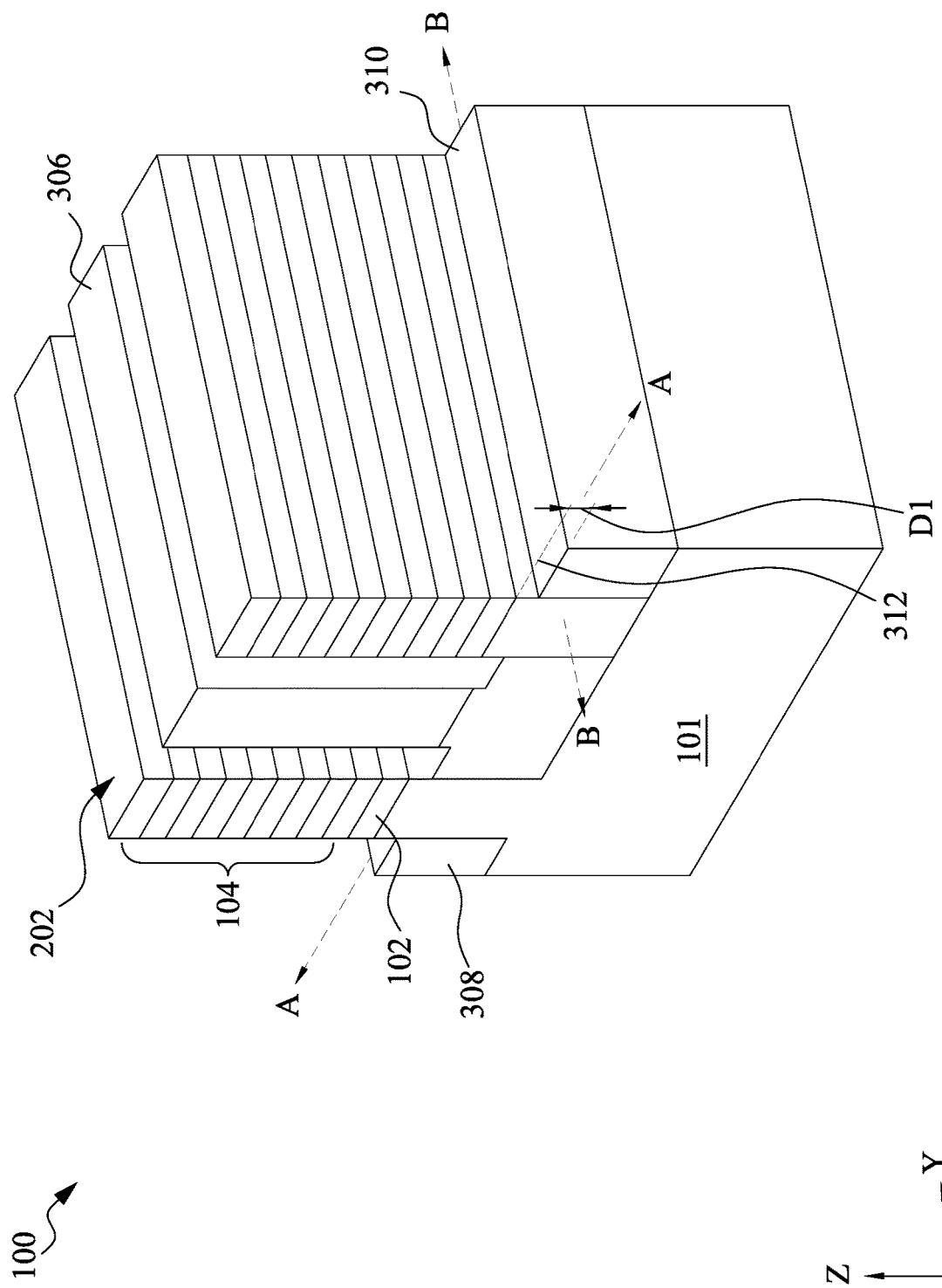
FIG. 4 is a perspective view of the semiconductor device structure at the manufacturing stage as shown in FIG. 3E, in accordance with some embodiments.
Figures 5A, 5B:
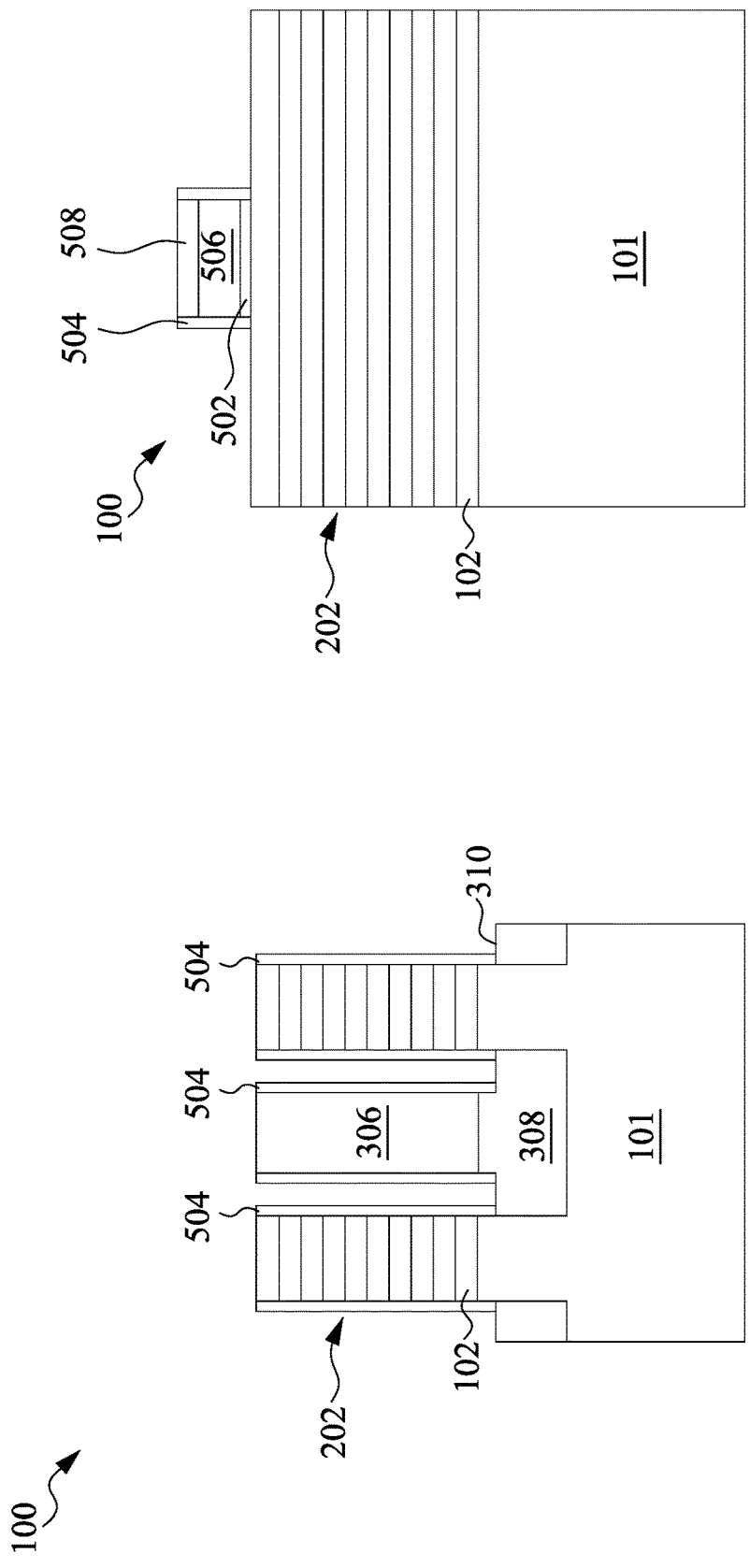
FIGS. 5A, 6A, 7A, 8A, 9A, and 10A are cross-sectional side views of various stages of manufacturing the semiconductor device structure taken along line A-A of FIG. 4, in accordance with some embodiments.
FIGS. 5B, 6B, 7B, 8B, 9B, and 10B are cross-sectional side views of various stages of manufacturing the semiconductor device structure taken along line B-B of FIG. 4, in accordance with some embodiments.

FIG. 4 is a perspective view of the semiconductor device structure 100 at the manufacturing stage as shown in FIG. 3E, in accordance with some embodiments. As shown in FIG. 4, the semiconductor device structure 100 includes the fins 202, the dielectric feature 306 disposed between adjacent fins 202, the isolation region 308 disposed on the substrate 101 and having the top surface 310 below the bottom surface 312 of the semiconductor layer 102. FIGS. 5A, 6A, 7A, 8A, 9A, and 10A are cross-sectional side views of various stages of manufacturing the semiconductor device structure 100 taken along line A-A of FIG. 4, in accordance with some embodiments. FIGS. 5B, 6B, 7B, 8B, 9B, and 10B are cross-sectional side views of various stages of manufacturing the semiconductor device structure 100 taken along line B-B of FIG. 4, in accordance with some embodiments. As shown in FIGS. 5A and 5B, a sacrificial gate dielectric layer 502 is formed on the fins 202, the dielectric feature 306, and the isolation region 308. The sacrificial gate dielectric layer 502 may include one or more layers of dielectric material, such as $SiO_2$, SiN, a high-K dielectric material, and/or other suitable dielectric material.

In some embodiments, the sacrificial gate dielectric layer 502 may be deposited by a CVD process, a sub-atmospheric CVD (SACVD) process, a FCVD process, an ALD process, a PVD process, or other suitable process. By way of example, the sacrificial gate dielectric layer 502 may be used to prevent damages to the fins 202 by subsequent processes (e.g., subsequent formation of the sacrificial gate stack). Next, a sacrificial gate electrode layer 506 and a hard mask 508 are formed. The sacrificial gate electrode layer 506 and the hard mask 508 may be referred to as the sacrificial gate stack. The sacrificial gate electrode layer 506 may be formed on the isolation region 308 and on a portion of each fin 202, and the hard mask 508 is deposited on the sacrificial gate electrode layer 506. In some embodiments, the sacrificial gate electrode layer 506 and the hard mask 508 are formed by various processes such as layer deposition, patterning, etching, as well as other suitable processing steps. Exemplary layer deposition processes include CVD (including both LPCVD and PECVD), PVD, ALD, thermal oxidation, e-beam evaporation, or other suitable deposition techniques, or combinations thereof. In forming the sacrificial gate electrode layer 506 and the hard mask 508, for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, other etching methods, and/or combinations thereof. In some embodiments, the sacrificial gate electrode layer 506 may be made of polycrystalline silicon (polysilicon). In some embodiments, the hard mask 508 may include more than one layer, such as an oxide layer and a nitride layer. For example, the hard mask 508 may include a $SiO_2$ layer and a SiN or SiON layer. By patterning the sacrificial gate stack, the fins 202 are partially exposed on opposite sides of the sacrificial gate stack, thereby defining source/drain (S/D) regions. In this disclosure, a source and a drain are interchangeably used, and the structures thereof are substantially the same. As shown in FIG. 5B, one sacrificial gate stack is formed, but the number of the sacrificial gate stacks is not limited to one. Two or more sacrificial gate stacks are arranged in the Y direction in some embodiments.

In some embodiments, after the formation of the sacrificial gate electrode layer 506 and the hard mask 508, the sacrificial gate dielectric layer 502 not covered by the sacrificial gate electrode layer 506 is removed from the portions of the fins 202. The sacrificial gate dielectric layer 502 disposed on the isolation region 308 may be also removed. The removal process may be an etch process, such as a wet etch, a dry etch, and/or a combination thereof. The etch process is chosen to selectively etch the sacrificial gate dielectric layer 502 without substantially etching the fins 202, the hard mask 508, the sacrificial gate electrode layer 506, and the isolation region 308.

Still referring to FIGS. 5A and 5B, a spacer 504 is formed on the sidewalls of the fins 202, dielectric feature 306, sacrificial gate electrode layer 506, and the hard mask 508. The spacer 504 may be formed by first depositing a conformal layer that is subsequently etched back to form sidewall spacers 504. For example, a spacer material layer can be disposed conformally on the isolation region 308, on the top of the hard mask 508, on the sidewall of the sacrificial gate electrode layer 506, and on tops and sidewalls of the fins 202 and dielectric feature 306. The term "conformally" may be used herein for ease of description upon a layer having substantial same thickness over various regions. The conformal spacer material layer may be formed by an ALD process. Subsequently, anisotropic etching is performed on the spacer material layer using, for example, RIE. During the anisotropic etching process, most of the spacer material layer is removed from horizontal surfaces, such as the tops of the fins 202, the dielectric feature 306, the isolation region 308, and the hard mask 508, leaving the spacers 504 on the vertical surfaces, such as the sidewalls of the fins 202, the dielectric feature 306, the sacrificial gate electrode layer 506, and the hard mask 508. The hard mask 508 may be exposed from the sidewall spacers. The spacer 504 may be made of a dielectric material such as silicon oxide, silicon nitride, silicon carbide, silicon oxynitride, SiCN, silicon oxycarbide, SiOCN, and/or combinations thereof. In some embodiments, the spacer 504 includes multiple layers, such as main spacer walls, liner layers, and the like.

Figures 6A, 6B:
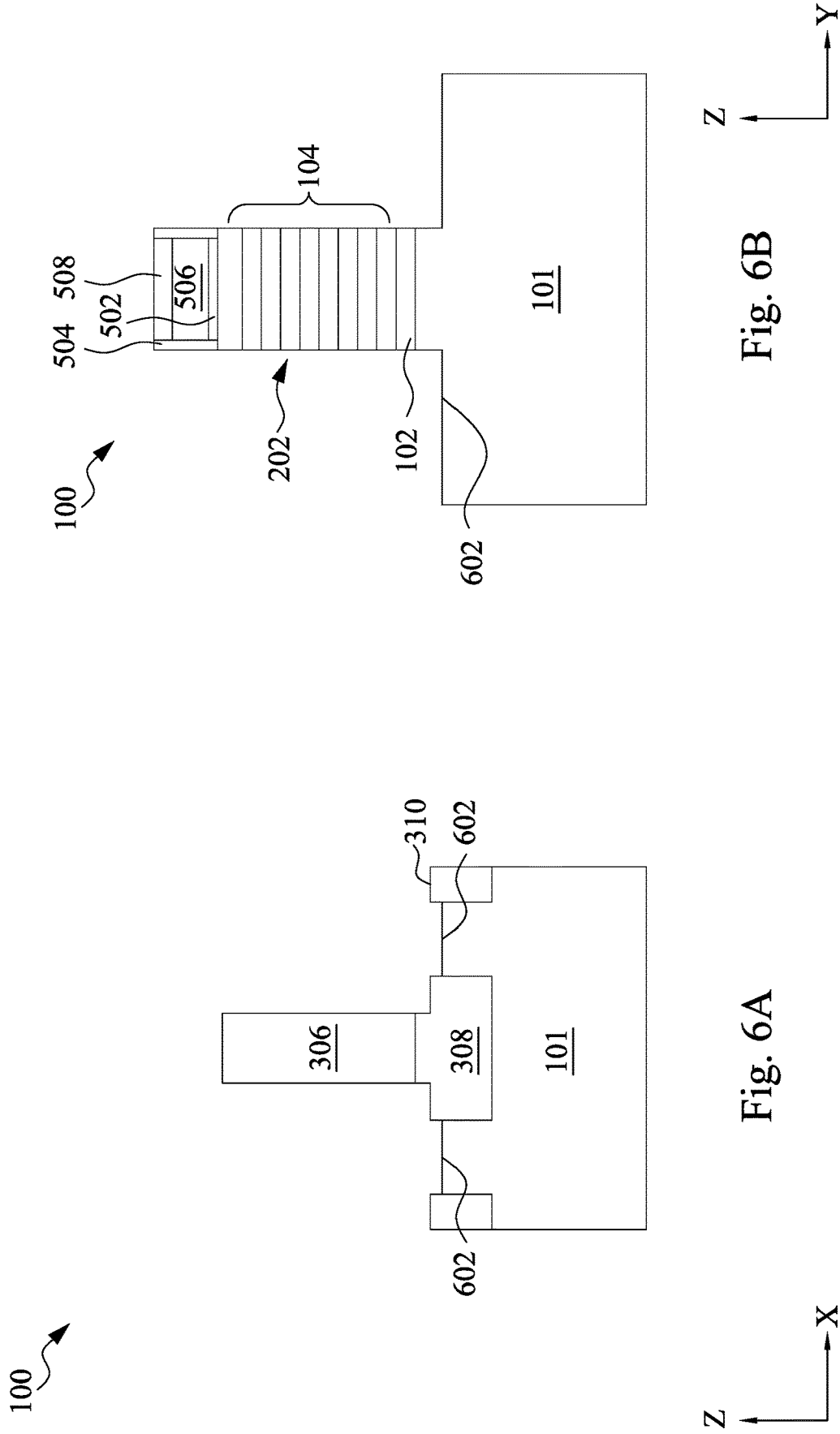

Next, as shown in FIGS. 6A and 6B, the portions of the fins 202 in the S/D regions are recessed down below the top surface 310 of the isolation region 308, by using dry etching and/or wet etching. Surfaces 602 of the substrate 101 may be exposed as the result of the recess of the portions of the fins 202. The spacers 504 formed on the sidewalls of the portions of the fins 202 in the S/D regions and the spacers 504 formed on the dielectric feature 306 may be also removed. At this stage, end portions of the stack of semiconductor layers 104 and the semiconductor layer 102 under the sacrificial gate stack have substantially flat surfaces which may be flush with the sidewall spacers 504, as shown in FIG. 6B. In some embodiments, the end portions of the stack of semiconductor layers 104 and the semiconductor layer 102 under the sacrificial gate stack are slightly horizontally etched.

Figure 7B:
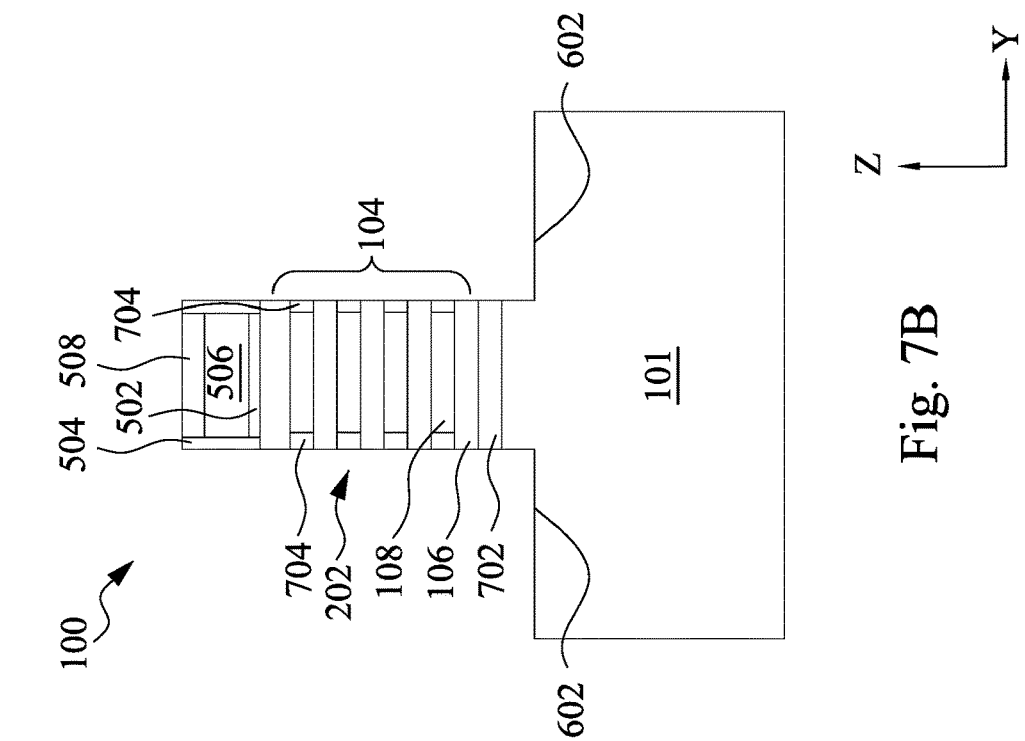
Figure 7A:
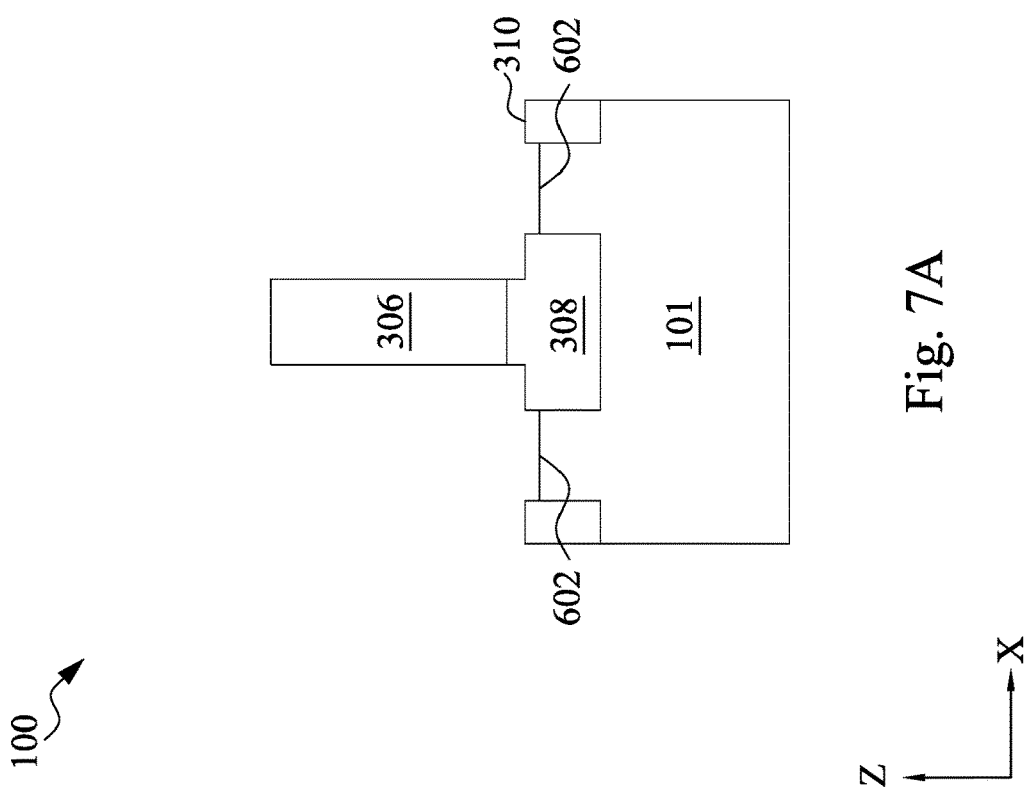

Next, as shown in FIGS. 7A and 7B, the semiconductor layers 102 and edge portions of each second semiconductor layer 108 are removed, forming a gap 702 and gaps 704. In some embodiments, the portions of the semiconductor layers 108 and the semiconductor layers 102 are removed by a selective wet etching process. For example, in cases where the second semiconductor layers 108 are made of SiGe having a first atomic percent germanium, the semiconductor layers 102 are made of SiGe having a second atomic percent germanium greater than the first atomic percent germanium, and the first semiconductor layers 106 are made of silicon, a selective wet etching including an ammonia and hydrogen peroxide mixtures (APM) may be used. With the APM etch, the semiconductor layers 102 are etched at a first etch rate, the second semiconductor layers 108 are etched at a second etch rate slower than the first etch rate, and the first semiconductor layers 106 are etched at a third etch rate slower than the second etch rate. As a result, the semiconductor layers 102 may be completely removed, while edge portions of the second semiconductor layers 108 may be removed, and the first semiconductor layers 106 are substantially unchanged. In some embodiments, the selective removal process may include SiGe oxidation followed by a $SiGeO_x$ removal.

Figure 8B:
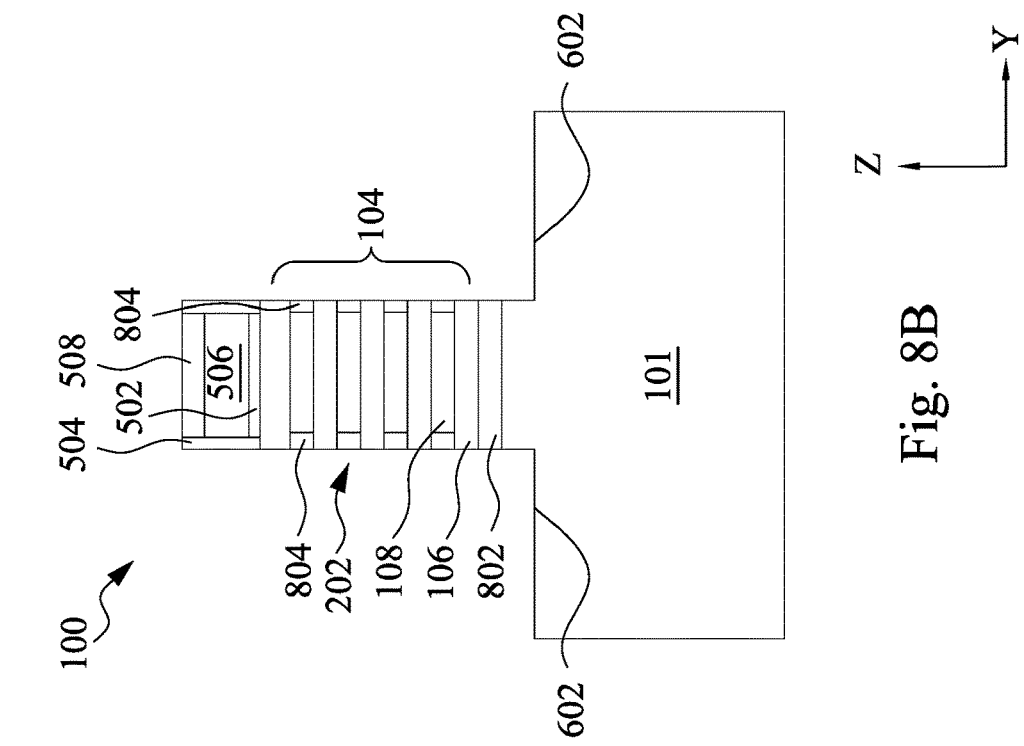
Figure 8A:
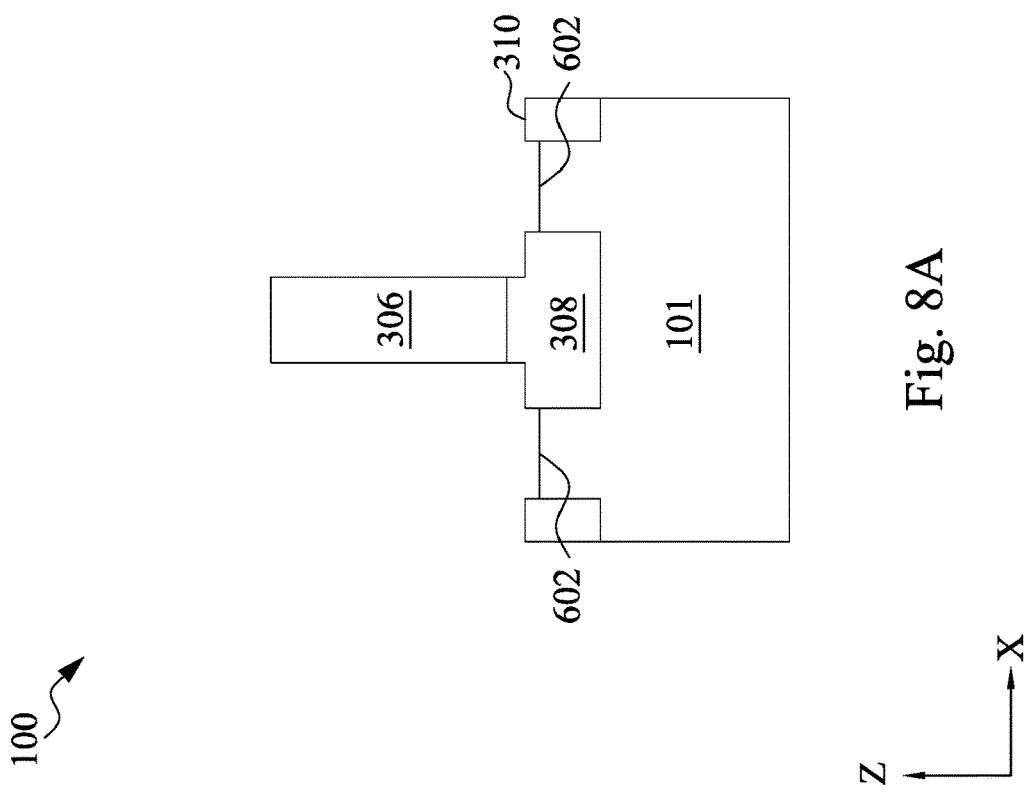

Next, as show in FIGS. 8A and 8B, a dielectric layer 802 is formed in the gap 702, and dielectric spacers 804 are formed in the gaps 704. In other words, the semiconductor layer 102 is replaced with the dielectric layer 802. In some embodiments, the dielectric layer 802 may be made of a low-K dielectric material, such as $SiO_2$, SiN, SiCN, SiOC, or SiOCN, or a high-K dielectric material, such as $HfO_2$, ZrOx, $ZrAlO_x$, $HfAlO_x$, $HfSiO_x$, $AlO_x$, or other suitable dielectric material. In some embodiments, the dielectric layer 802 may be made of TiO, TaO, LaO, YO, TaCN, or ZrN. The dielectric spacers 804 may be made of a low-K dielectric material, such as SiON, SiCN, SiOC, SiOCN, or SiN. In some embodiments, the dielectric layer 802 and the dielectric spacers 804 are made of the same dielectric material. For example, the dielectric layer 802 and the dielectric spacers 804 may be formed by first forming a conformal dielectric layer using a conformal deposition process, such as ALD, followed by an anisotropic etching to remove portions of the conformal dielectric layer other than the dielectric layer 802 and the dielectric spacers 804. The dielectric layer 802 and the dielectric spacers 804 may be protected by the first semiconductor layers 106 during the anisotropic etching process. The dielectric layer 802 may have a thickness ranging from about 5 nm to about 30 nm and a width ranging from about 5 nm to about 30 nm. The dielectric layer 802 serves to protect the channel regions during the subsequent removal of the substrate 101. Thus, if the thickness of the dielectric layer 802 is less than about 5 nm, the dielectric layer 802 may not be sufficient to protect the channel regions. On the other hand, if the thickness of the dielectric layer 802 is greater than about 30 nm, the manufacturing cost is increased without significant advantage. The width of the dielectric layer 802 is defined by the length of the channel region that extends from an S/D epitaxial layer 902 (FIGS. 9A and 9B) serving as a source region to an S/D epitaxial layer 902 (FIGS. 9A and 9B) serving as a drain region.

Figure 9B:
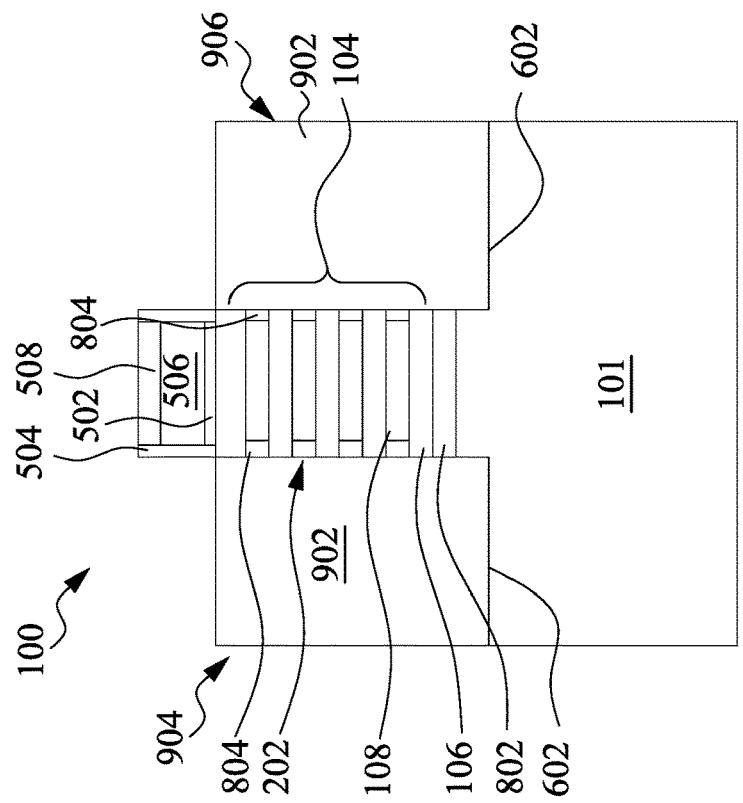
Figure 9A:
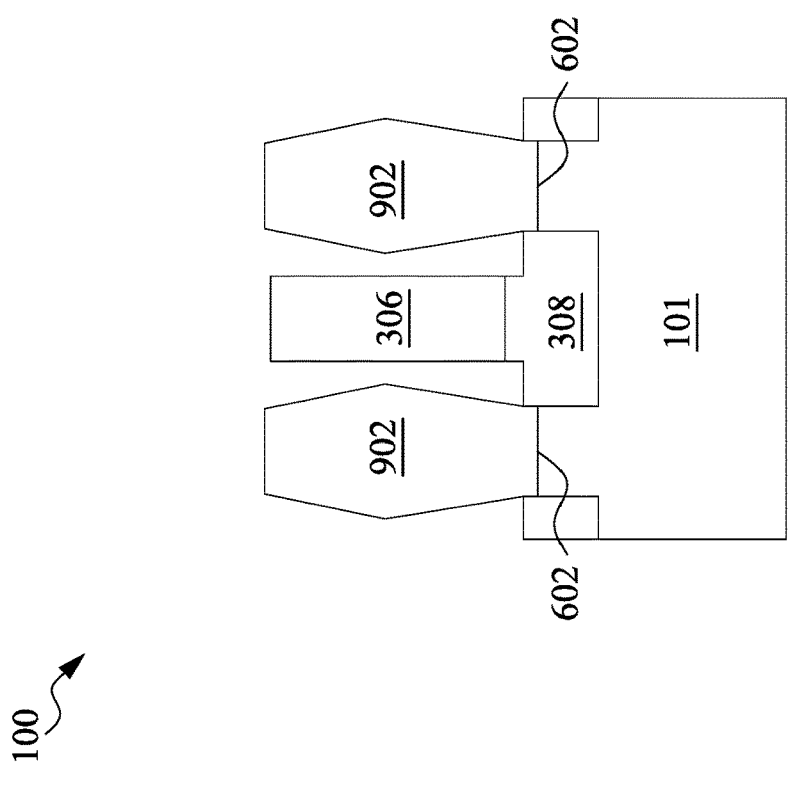

Next, as shown in FIGS. 9A and 9B, S/D epitaxial layers 902 are formed on the exposed surfaces 602 of the substrate 101. The S/D epitaxial layer 902 may be made of one or more layers of Si, SiP, SiC and SiCP for an n-channel FET or Si, SiGe, Ge for a p-channel FET. The S/D epitaxial layers 902 are formed by an epitaxial growth method using CVD, ALD or MBE. The S/D epitaxial layers 902 are in contact with the stack of the semiconductor layers 104 and the dielectric layer 802, as shown in FIG. 9B. The S/D epitaxial layers 902 may be the S/D regions. For example, one of a pair of S/D epitaxial layers 902 located on one side of the stack of semiconductor layers 104 is a source region 904, and the other of the pair of S/D epitaxial layers 902 located on the other side of the stack of semiconductor layers 104 is a drain region 906. A pair of S/D epitaxial layers 902 is referring to a source epitaxial layer 902 and a drain epitaxial layer 902 connected by the channels (i.e., the first semiconductor layers 106).

Figure 10B:
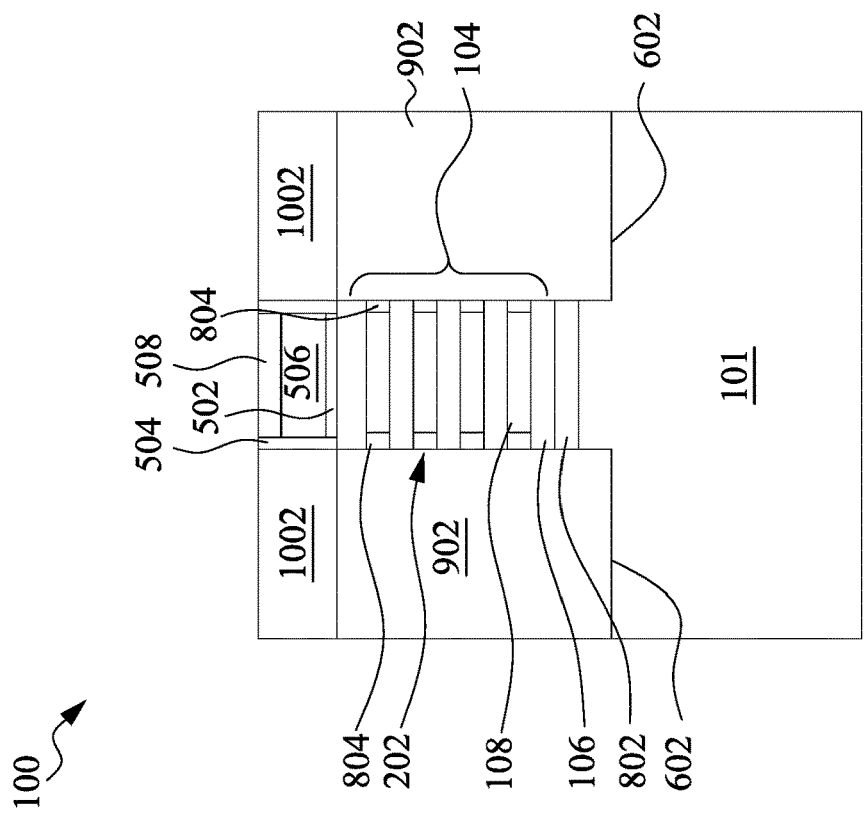
Figure 10A:
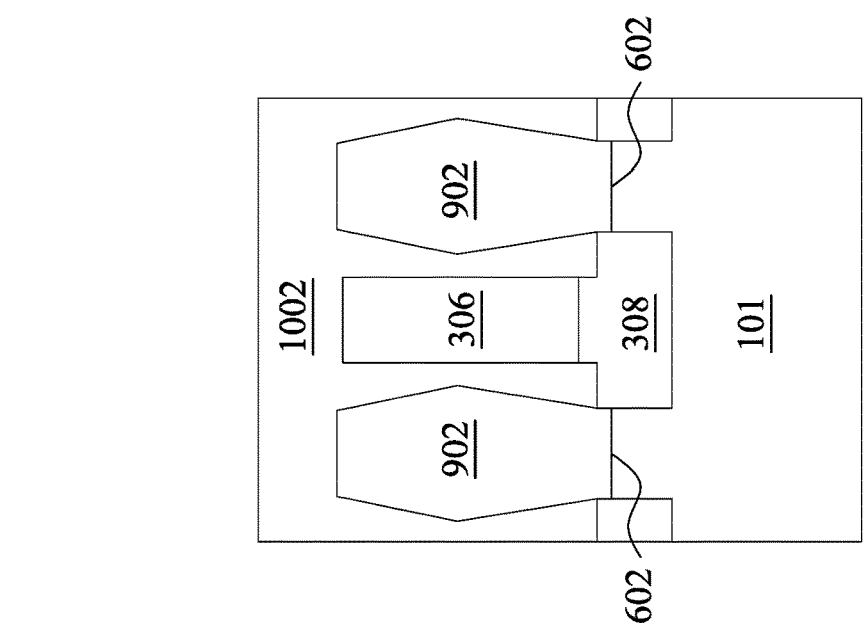

Subsequently, an interlayer dielectric (ILD) layer 1002 is formed on the S/D epitaxial layers 902 and the dielectric feature 306, as shown in FIGS. 10A and 10B. A contact etch stop layer (CESL) (not shown) may be formed prior to forming the ILD layer 1002. The materials for the ILD layer 1002 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 1002 may be deposited by a PECVD process or other suitable deposition technique. In some embodiments, after formation of the ILD layer 1002, the semiconductor device structure 100 may be subject to a thermal process to anneal the ILD layer 1002.

Figure 11:
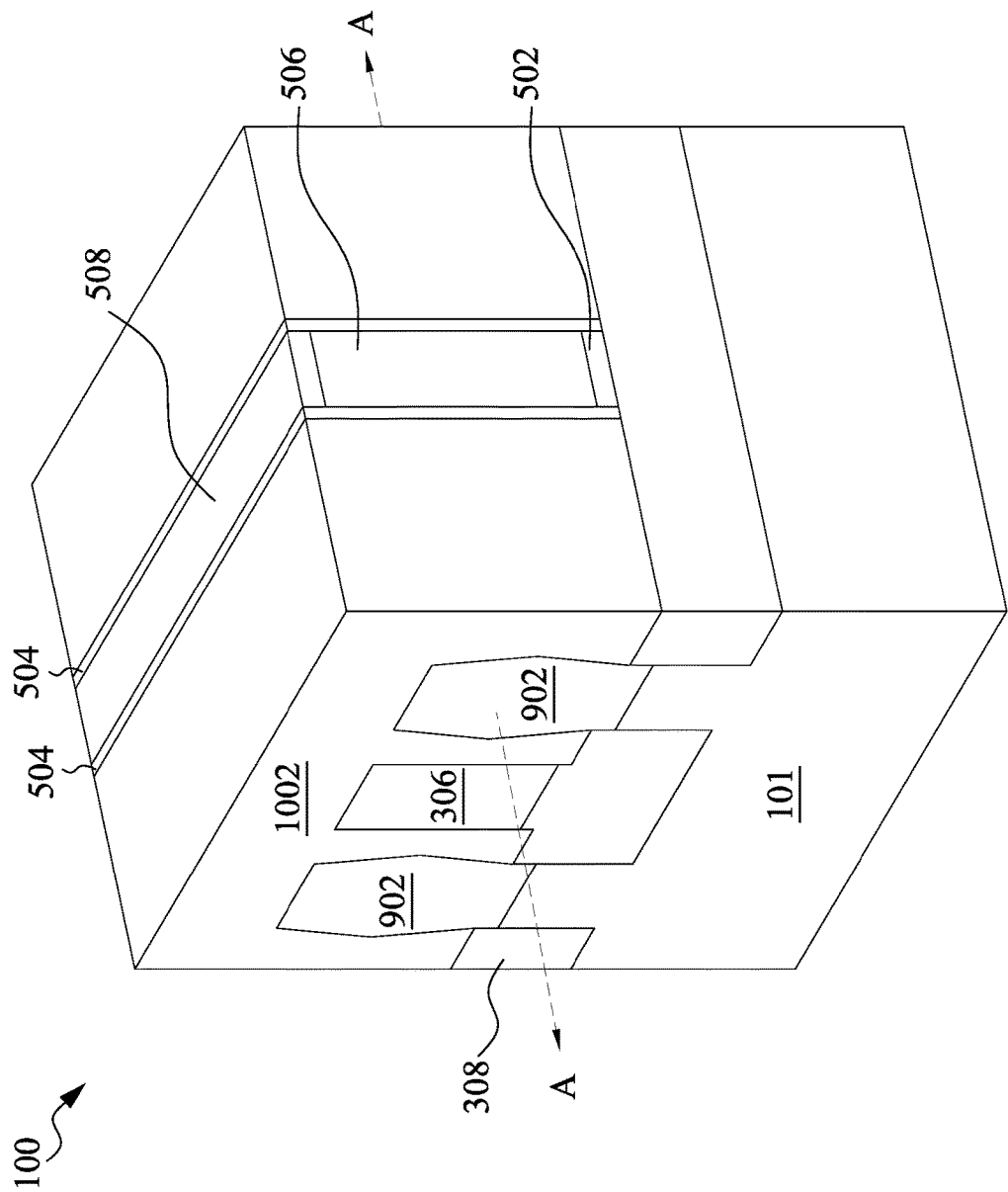
FIG. 11 is a perspective view of the semiconductor device structure at a manufacturing stage as shown in FIG. 10B, in accordance with some embodiments.
Figures 12A, 12B:
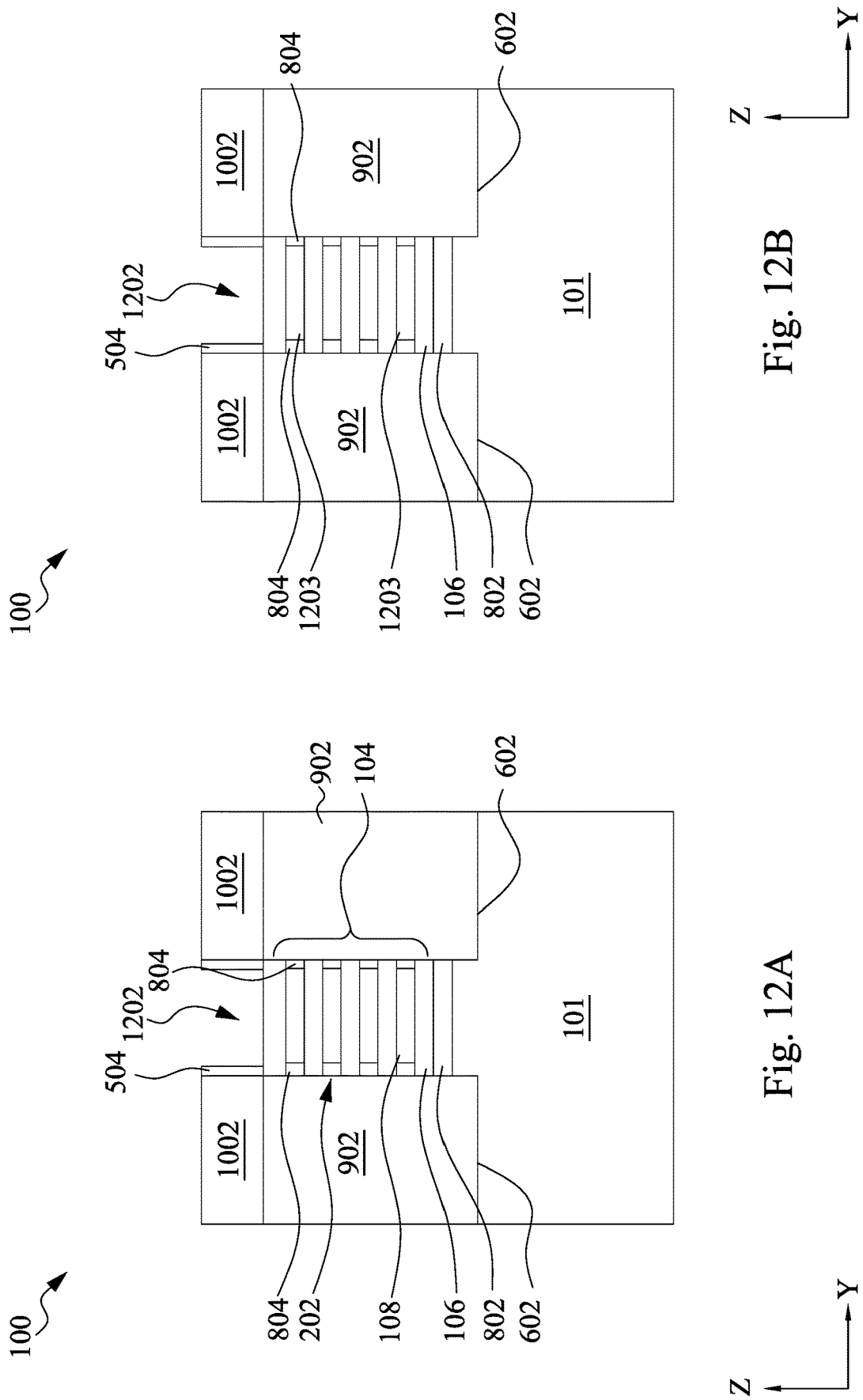
FIGS. 12A-12C are cross-sectional side views of various stages of manufacturing the semiconductor device structure taken along line A-A of FIG. 11, in accordance with some embodiments.
Figure 12C:
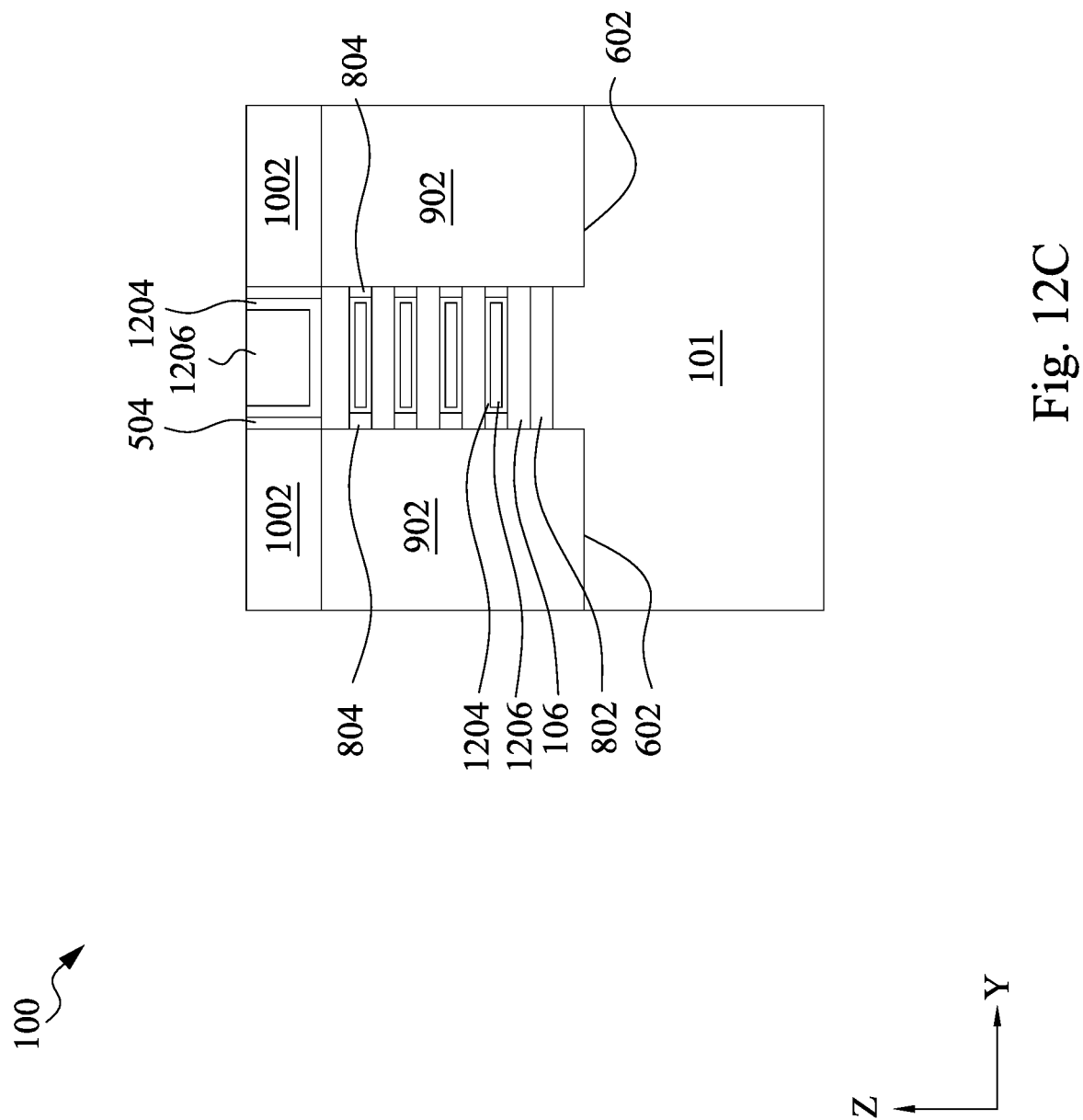

FIG. 11 is a perspective view of the semiconductor device structure 100 at the manufacturing stage as shown in FIG. 10B, in accordance with some embodiments. FIGS. 12A, 12B, and 12C are cross-sectional side views of various stages of manufacturing the semiconductor device structure 100 taken along line A-A of FIG. 11, in accordance with some embodiments. Next, as shown in FIG. 12A, the hard mask 508, the sacrificial gate electrode layer 506, and the sacrificial gate dielectric layer 502 may be removed to expose the top of the stack of semiconductor layers 104. The ILD layer 1002 protects the S/D epitaxial layers 902 during the removal of the sacrificial gate stack. The hard mask 508 may be removed by any suitable method, such as CMP. The sacrificial gate stack can be removed using plasma dry etching and/or wet etching. For example, in cases where the sacrificial gate electrode layer 506 is polysilicon and the ILD layer 1002 is silicon oxide, a wet etchant such as a tetramethylammonium hydroxide (TMAH) solution can be used to selectively remove the sacrificial gate electrode layer 506. The sacrificial gate dielectric layer 502 is thereafter removed using plasma dry etching and/or wet etching. The removal of the sacrificial gate stack (i.e., the sacrificial gate electrode layer 506 and the sacrificial gate dielectric layer 502) forms a trench 1202 between the S/D epitaxial layers 902. The stacks of semiconductor layers 104 and the dielectric layer 802 are exposed in the trench 1202.

Next, the remaining portion of each second semiconductor layer 108 is removed, and gaps 1203 are formed between the dielectric spacers 804, as shown in FIG. 12B. The removal process may be any suitable selective removal process, such as selective wet etching process. In some embodiments, the second semiconductor layers 108 are made of SiGe, the first semiconductor layers 106 are made of Si, and the chemistry used in the removal process removes the SiGe while not substantially affecting Si and the dielectric materials of the spacer 504, the dielectric spacers 804, and the dielectric layer 802. The resulting structure includes a plurality of first semiconductor layers 106 separated by pairs of the dielectric spacers 804 having gaps 1203 formed between each pair of the dielectric spacers 804. Each first semiconductor layer 106 may have a surface along the longitudinal direction of the semiconductor layer 106, and the majority of that surface is exposed as the result of the removal of the second semiconductor layers 108. The exposed surface will be surrounded by a gate electrode layer formed subsequently. Each first semiconductor layer 106 may be a nanosheet channel of the nanosheet transistor.

After the formation of the nanosheet channels (i.e., the exposed first semiconductor layers 106), a gate dielectric layer 1204 is formed around each first semiconductor layer 106, and a gate electrode layer 1206 is formed on the gate dielectric layer 1204, surrounding a portion of each first semiconductor layer 106, as shown in FIG. 12C. The gate electrode layer 1206 and the gate dielectric layer 1204 may be collectively referred to as a gate stack. In some embodiments, the gate dielectric layer 1204 includes one or more layers of a dielectric material, such as silicon oxide, silicon nitride, or high-K dielectric material, other suitable dielectric material, and/or combinations thereof. Examples of high-K dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-K dielectric materials, and/or combinations thereof. In some embodiments, the gate dielectric layer 1204 includes an interfacial layer formed between the first semiconductor layers 106 and the dielectric material.

The gate dielectric layer 1204 may be formed by CVD, ALD or any suitable method. In one embodiment, the gate dielectric layer 1204 is formed using a conformal deposition process such as ALD in order to ensure the formation of a gate dielectric layer having a uniform thickness around each first semiconductor layer 106. The thickness of the gate dielectric layer 1204 may range from about 1 nm to about 6 nm, in one embodiment.

The gate electrode layer 1206 is formed on the gate dielectric layer 1204 to surround a portion of each first semiconductor layer 106. The gate electrode layer 1206 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 1206 may be formed by CVD, ALD, electro-plating, or other suitable method. The gate electrode layer 1206 may be also deposited over the upper surface of the ILD layer 1002. The gate dielectric layer 1204 and the gate electrode layer 1206 formed over the ILD layer 1002 are then removed by using, for example, CMP, until the top surface of the ILD layer 1002 is exposed, as shown in FIG. 12C.

Figure 13:
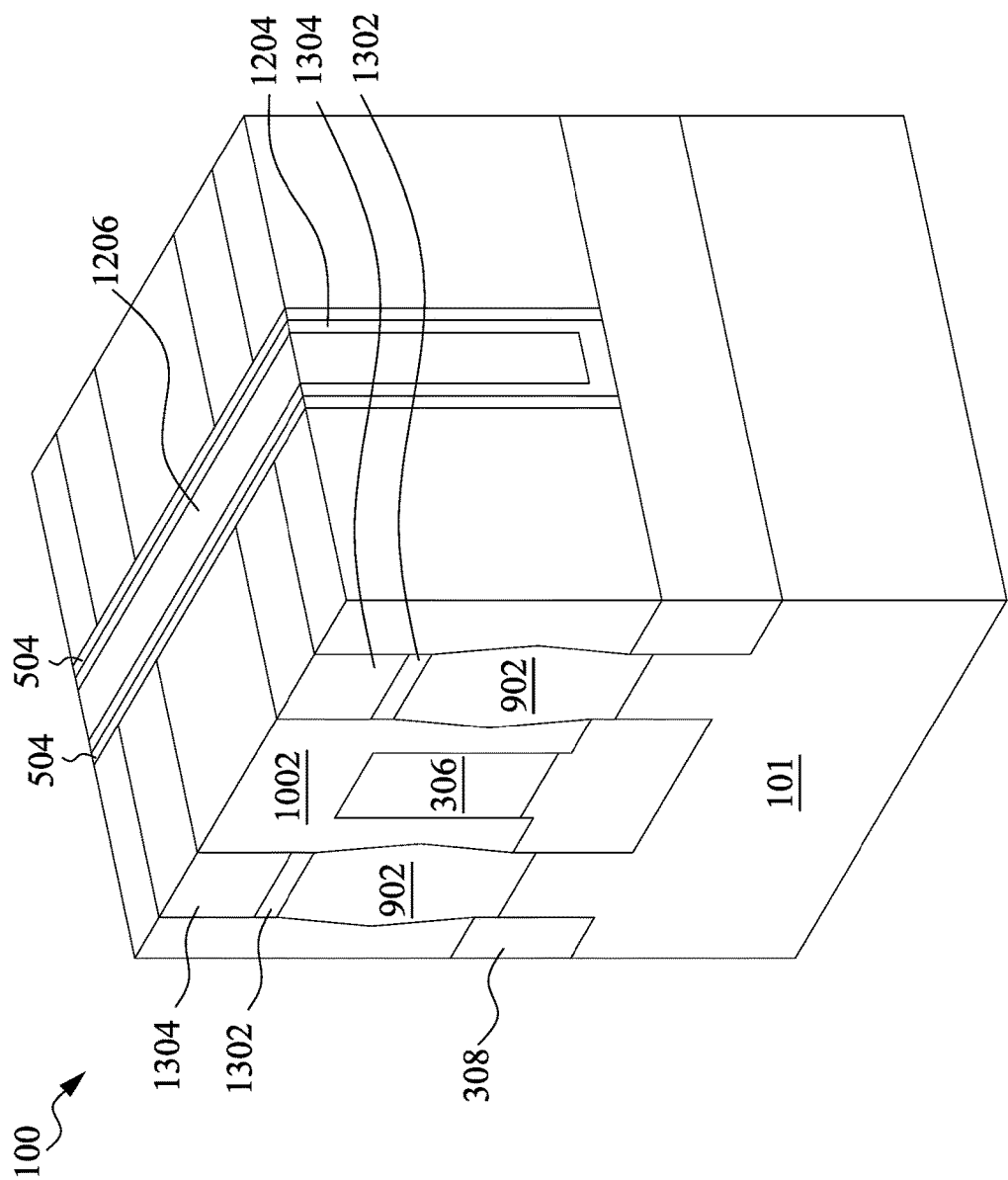
FIG. 13 is a perspective view of the semiconductor device structure at a manufacturing stage, in accordance with some embodiments.

FIG. 13 is a perspective view of the semiconductor device structure 100 at a manufacturing stage, in accordance with some embodiments. After forming the gate electrode layer 1206, contact holes are formed in the ILD layer 1002 to expose the S/D epitaxial layers 902. The contact holes may be formed by any removal process, such as dry etching. In some embodiments, the upper portions of the S/D epitaxial layers 902 are etched.

A silicide layer 1302 is formed on the S/D epitaxial layer 902, as shown in FIG. 13. The silicide layer 1302 may be made of a material including one or more of WSi, CoSi, NiSi, TiSi, MoSi and TaSi. In some embodiments, the silicide layer 1302 is made of a metal or metal alloy silicide, and the metal includes a noble metal, a refractory metal, a rare earth metal, alloys thereof, or combinations thereof. The silicide layer 1302 may have a thickness ranging from about 1 nm to about 10 nm. Next, a conductive material 1304 is formed in the contact holes as shown in FIG. 13. The conductive material 1304 may be made of a material including one or more of Ru, Mo, Co, Ni. W, Ti, Ta, Cu, Al, TiN and TaN. The conductive material 1304 may have a thickness ranging from about 1 nm to about 50 nm.

FIG. 14 is a perspective view of the semiconductor device structure 100 at a manufacturing stage, in accordance with some embodiments. As shown in FIG. 14, an interconnecting structure 1402 is formed on the substrate 101. Features formed on the substrate 101 as shown in FIG. 13 are omitted for clarity. The interconnecting structure 1402 includes a dielectric material having a plurality of metal lines (not shown) and vias (not shown) embedded therein. The metal lines and vias provide electrical paths to the features, such as the gate electrode layer 1206 and S/D epitaxial layers 902. The substrate 101 with the interconnecting structure 1402 may be bonded to a carrier substrate 1404. The carrier substrate 1404 may be bonded to the interconnecting structure 1402 using an adhesion. The carrier substrate 1404 serves to provide mechanical support for the semiconductor device structure 100 so as to facilitate further processing.

Semiconductor devices may include multiple metal tracks, including power rails, such a positive voltage rail (VDD) and a ground rail (GND); and multiple signal lines. In some conventional semiconductor devices, the power rails and signal lines are located over the substrate 101, such as in the interconnecting structure 1402. As semiconductor device size shrinks, however, space for metal tracks, such as power rails and signal lines, decreases. Thus, one or more power rails may be formed on the back side of the substrate 101. In some embodiments, either the source or the drain of the S/D epitaxial layers 902 is connected to a power rail disposed therebelow. For example, a source epitaxial layer 902 is connected to a power rail disposed therebelow, and a drain epitaxial layer 902 is connected to a power rail disposed thereabove. FIGS. 15A-15H are perspective views of various stages of manufacturing the semiconductor device structure 100 having a back-side power rail, in accordance with some embodiments.

As shown in FIG. 15A, the semiconductor device structure 100 is flipped over so the substrate 101 as shown is over the S/D epitaxial layers 902. In some embodiments, the semiconductor device structure 100 is flipped over after the carrier substrate 1404 (FIG. 14) is bonded to the semiconductor device structure 100. The semiconductor device structure 100 includes the dielectric feature 306 disposed on and in contact with the liner 1502, and the liner 1502 may be made of any suitable dielectric material. The dielectric feature 306 and the liner 1502 may be referred to as the hybrid fin 1523. As described previously in FIG. 3E, the isolation region 308 is formed by recessing the insulating material 302 to a location below the plane defined by the bottom surface 312 of the semiconductor layer 102 to expose the semiconductor layer 102. Subsequently, the exposed semiconductor layer 102 is replaced with the dielectric layer 802, and the plane defined by the bottom surface 312 of the semiconductor layer 102 is also defined by a bottom surface 1506 of the dielectric layer 802. Thus, as shown in FIG. 15A, the gate electrode layer 1206 includes one or more portions 1504 adjacent the dielectric layer 802 and extending above the plane defined by the bottom surface 1506 of the dielectric layer 802. Each portion 1504 is covered by a portion of the gate dielectric layer 1204. Each portion 1504 of the gate electrode layer 1206 has a surface 1519 located above the plane defined by the bottom surface 1506 of the dielectric layer 802 (the surface 1519 is located below the plane defined by the bottom surface 1506 of the dielectric layer 802 if the semiconductor device structure 100 is flipped back). The surface 1519 may be a covered by the gate dielectric layer 1204. The dielectric layer 802 may be in contact with the substrate 101, and the portion 1504 of the gate electrode layer 1206 may be adjacent both the dielectric layer 802 and the substrate 101. The portion 1504 of the gate electrode layer 1206 may be covered by and in contact with the portion of the gate dielectric layer 1204, and the portion of the gate dielectric layer 1204 is in contact with the substrate 101 and the dielectric layer 802.

The back side of the substrate 101 is thinned down to reduce the total thickness of the substrate 101 and to expose the isolation region 308, and a hard mask 1508 is formed on a portion of the substrate 101 over the S/D epitaxial layer 902 to be connected to a back-side power rail, as shown in FIG. 15A. In some embodiments, the hard mask 1508 is formed on the portion of the substrate 101 over the source epitaxial layer 902. The thinning process may be any suitable process, such as CMP, mechanical grinding, wet etching, dry etching, or combinations thereof. In some embodiments, the substrate 101 is an SOI substrate, and the bottom Si layer and the oxide layer are removed during the thinning process. The hard mask 1508 may be formed by a photolithography process and one or more etch processes. The hard mask 1508 may be made of the same material as the hard mask 508 shown in FIG. 5B. In some embodiments, the hard mask 1508 covers portions of the substrate 101 disposed over multiple source epitaxial layers 902.

Figure 15B:
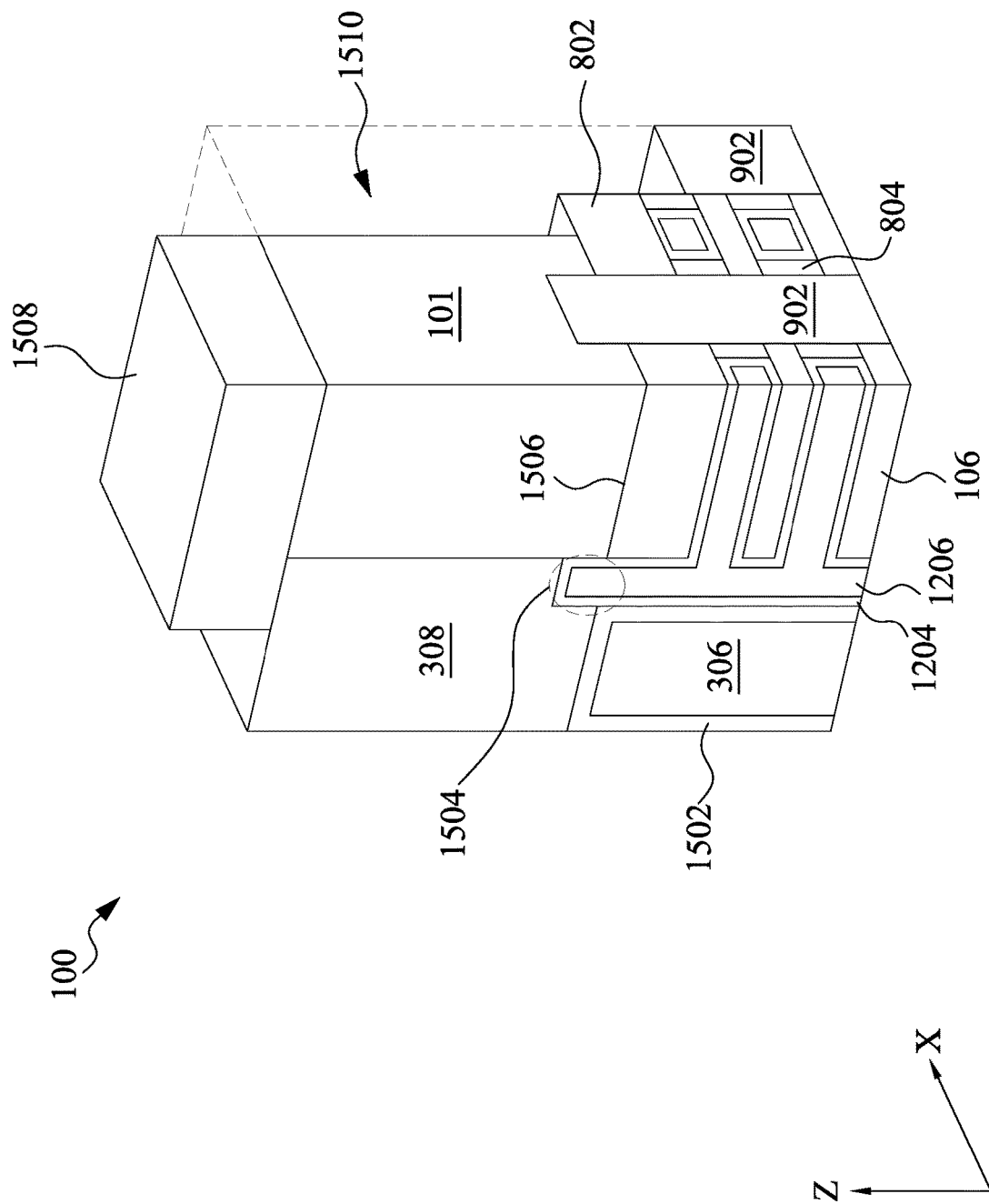

Next, as shown in FIG. 15B, the portion of the substrate 101 not covered by the hard mask 1508 is removed. The removal process may be any suitable process, such as anisotropic etching. In some embodiments, the removal process may be an anisotropic wet etching process that utilizes TMAH, which selectively removes the semiconductor material of the substrate 101. The isolation region 308 and the dielectric layer 802 are not removed by the removal process. The dielectric layers 802 serves to protect the channel regions during the removal of the substrate 101. In some embodiments, a portion of the S/D epitaxial layer 902 disposed below the removed portion of the substrate 101 is also removed due to over etching. The removal of the portion of the substrate 101 forms an opening 1510 exposing the S/D epitaxial layer 902, a portion of the dielectric layer 802, and a portion of the gate dielectric layer 1204 covering the portion 1504 of the gate electrode layer 1206 (blocked by the remaining portion of the substrate 101, thus not visible in FIG. 15B) adjacent the exposed S/D epitaxial layer 902. In some embodiments, the exposed S/D epitaxial layer 902 is a drain epitaxial layer 902. FIG. 15B shows one S/D epitaxial layer 902 is exposed through one opening 1510. In some embodiments, multiple S/D epitaxial layers 902 are exposed through multiple openings 1510. For example, multiple drain epitaxial layers 902 are exposed through multiple openings 1510 formed in the substrate 101, and each portion of the gate dielectric layer 1204 covering each portion 1504 of the gate electrode layer 1206 adjacent each drain epitaxial layer 902 is exposed.

Figure 15C:
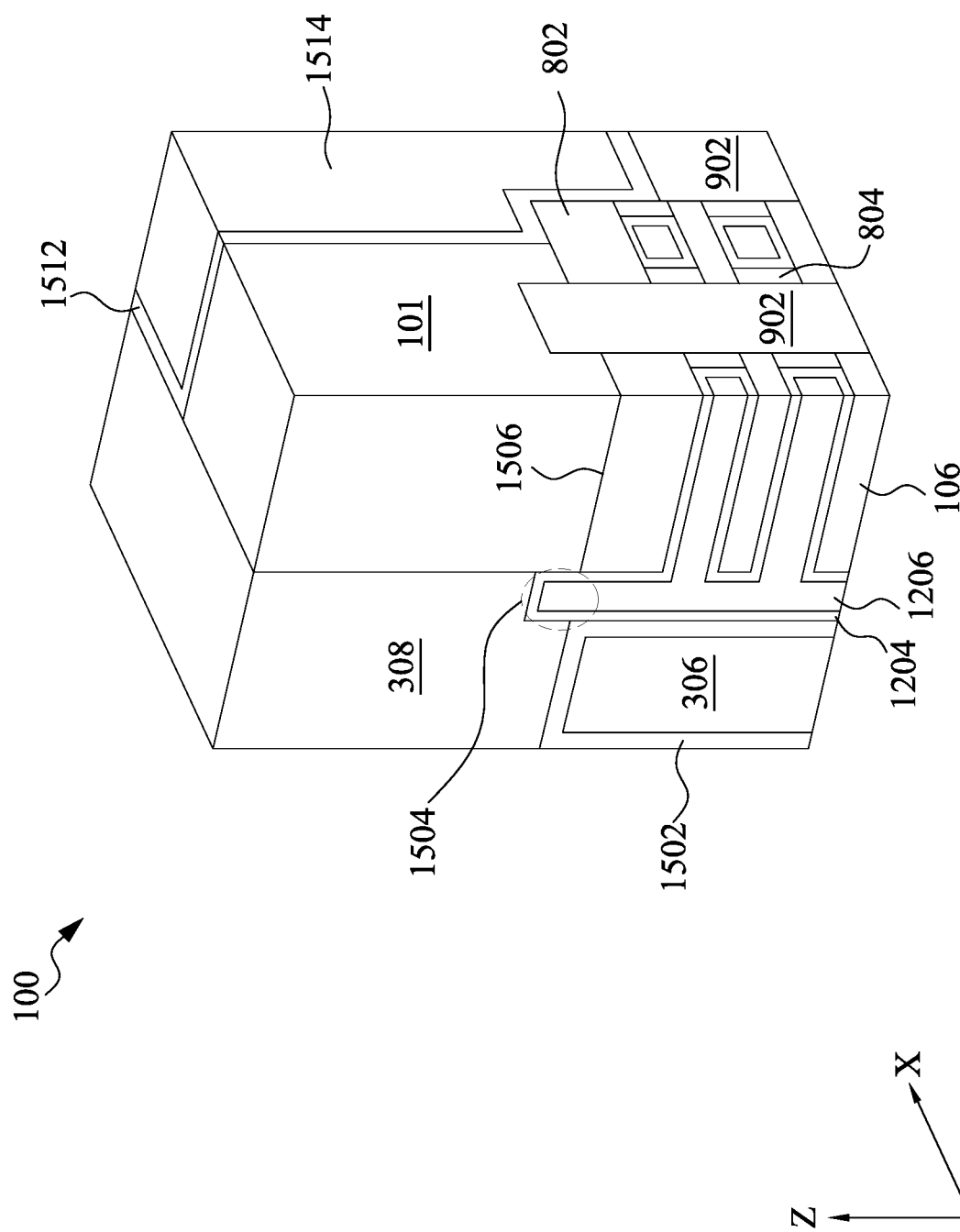

Next, as shown in FIG. 15C, a liner 1512 is formed on the exposed S/D epitaxial layer 902, the exposed portion of the dielectric layer 802, the exposed surface of the remaining portion of the substrate 101, the exposed portion of the gate dielectric layer 1204 (not visible in FIG. 15C), and the exposed surface of the isolation region 308. The liner 1512 may be made of a dielectric material, such as SiN. The liner 1512 may be formed by a conformal process, such as an ALD process. A dielectric material 1514 is then formed on the liner 1512 and fills the opening 1510. The dielectric material 1514 may be any suitable dielectric material, such as an oxide, for example silicon oxide. In some embodiments, the dielectric material 1514 is made of the same material as the isolation region 308. The dielectric material 1514 may be formed by any suitable method, such as CVD, PECVD, or FCVD. The dielectric material 1514 may be formed by first filling a dielectric material in the opening 1510 and on the isolation region 308 and the hard mask 1508, and followed by a CMP process to remove the dielectric material so that top surfaces of the isolation region 308 and the hard mask 1508 (or the remaining portion of the substrate 101) are co-planar. The hard mask 1508 may be also removed by the CMP process, as shown in FIG. 15C. In the embodiment where multiple S/D epitaxial layers 902 were exposed through multiple openings 1510, multiple dielectric materials 1514 are formed in the multiple openings 1510. For example, multiple dielectric materials 1514 are formed in the multiple openings 1510 over multiple drain epitaxial layers 902.

Figure 15D:
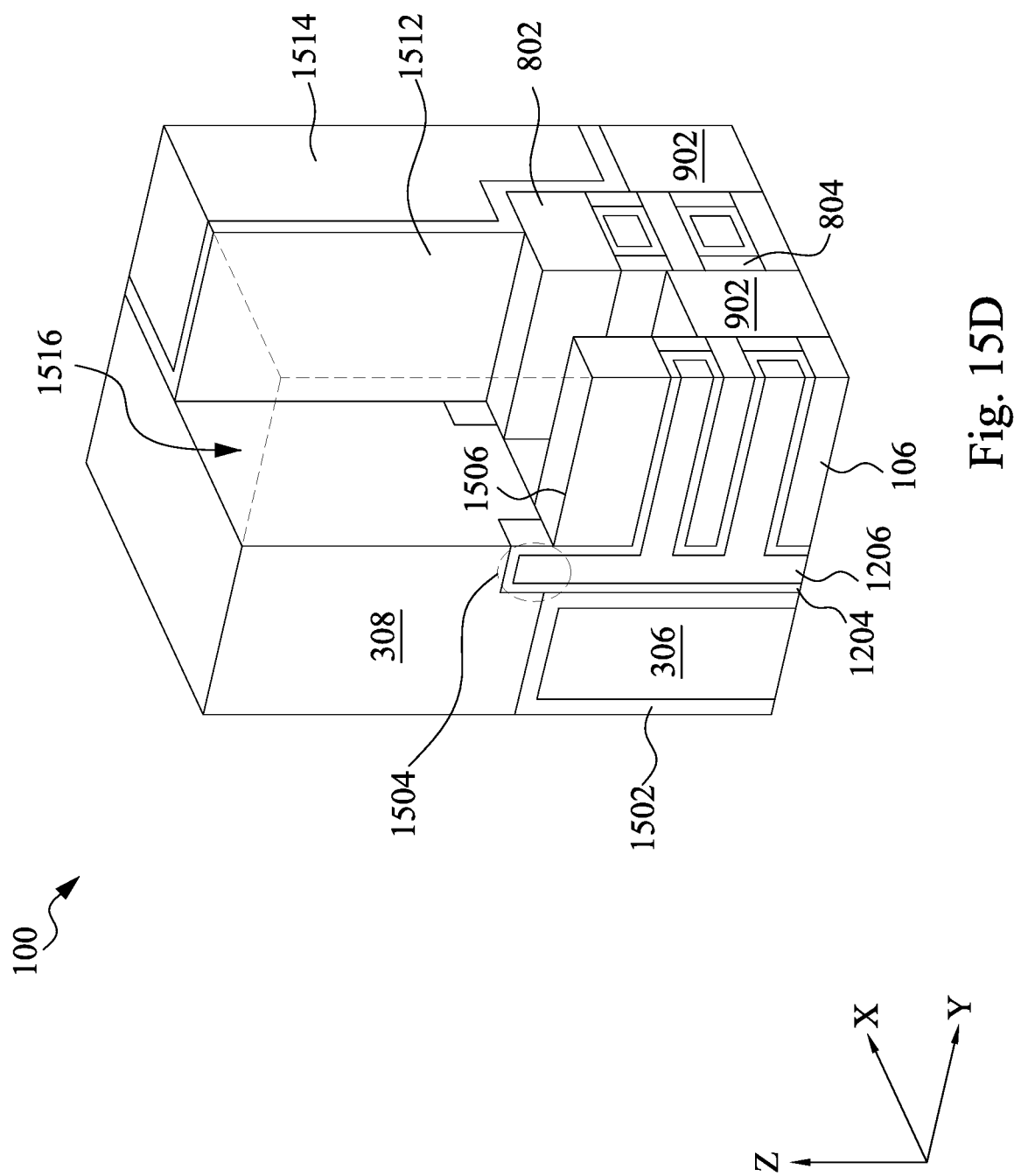

Next, as shown in FIG. 15D, the remaining portion of the substrate 101 that was covered by the hard mask 1508 (FIG. 15A) is removed. The removal process may be any suitable process, such as isotropic etching. In some embodiments, the removal process may be an isotropic dry etching process that utilizes hydrogen fluoride gas, which selectively removes the semiconductor material of the substrate 101. The isolation region 308, the liner 1512, the gate dielectric layer 1204, and the dielectric layer 802 are not removed by the removal process. The removal of the remaining portion of the substrate 101 exposes the S/D epitaxial layer 902 that was previously protected by the hard mask 1508, the portion of the gate dielectric layer 1204 covering the portion 1504 of the gate electrode layer 1206 adjacent the exposed S/D epitaxial layer 902, a portion of the surface 1506 of the dielectric layer 802, a portion of the liner 1512, and a portion of the isolation region 308. The removal of the remaining portion of the substrate 101 forms an opening 1516. In some embodiments, after removing the remaining portion of the substrate 101, the substrate 101 is completely removed from the semiconductor device structure 100, so that a plurality of drain epitaxial layers 902 is disposed below the dielectric material 1514, and a plurality of source epitaxial layers 902 is exposed through a plurality of openings 1516.

The opening 1516 will be filled with a conductive feature in subsequent processes. As the portion 1504 of the gate electrode layer 1206 adjacent one of a pair of the S/D epitaxial layers 902, such as adjacent each source epitaxial layer 902, is separated from the conductive feature by a thin layer (the gate dielectric layer 1204), an electrical short can happen between the gate electrode layer 1206 and the conductive feature to be filled in the opening 1516. The electrical short can lead to time-dependent dielectric breakdown (TDDB) of the gate dielectric layer 1204. Thus, the gate electrode layer 1206 is recessed to a level below the plane defined by the surface 1506 of the dielectric layer 802 (i.e., removing the portion 1504), which is described in FIG. 15E.

Figure 15E:
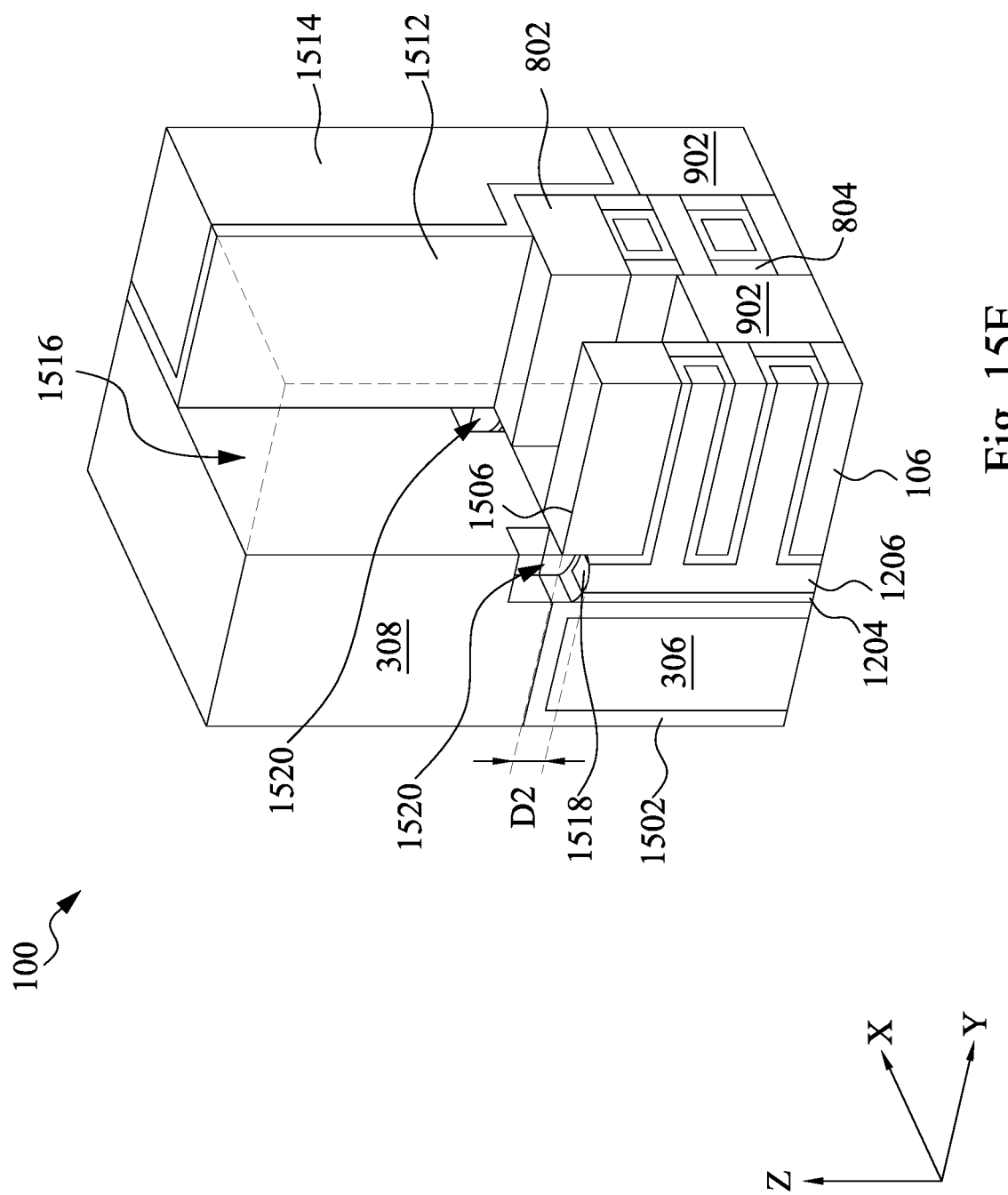

Next, as shown in FIG. 15E, the exposed portion of the gate dielectric layer 1204 and the portion 1504 covered by the exposed portion of the gate dielectric layer 1204 are removed. The removal process may be any suitable process, such as dry etching, wet etching, or atomic layer etching (ALE). In some embodiments, the exposed portion of each gate dielectric layer 1204 and the portion 1504 of each gate electrode layer 1206 covered thereby are removed by one or more selective etching process. For example, a first selective etching process is performed to remove the exposed portion of each gate dielectric layer 1204, followed by a second selective etching process to remove the portion 1504 of each gate electrode layer 1206. The removal of the portion 1504 of each gate electrode layer 1206 exposes a surface 1518 of the gate electrode layer 1206. The surface 1518 is a distance D2 away from the plane defined by the surface 1506 of the dielectric layer 802. In other words, the surface 1518 of the gate electrode layer 1206 is disposed above the plane defined by the surface 1506 of the dielectric layer 802 by the distance D2, when the semiconductor device structure 100 is flipped back. In some embodiments, the distance D2 may be greater than 4.5 nm, such as from about 4.5 nm to about 30 nm. The distance D2 is provided to isolate the conductive feature to be formed in the opening 1516 from the gate electrode layer 1206, thereby reducing TDDB failure that may be caused by the gate electrode layer 1206 being too close to the conductive feature to be formed in the opening 1516. In some embodiments, the distance D2 may be 15 percent to 100 percent of the thickness of the dielectric layer 802. If the distance D2 is greater than 30 nm or greater than 100 percent of the thickness of the dielectric layer 802, the risk of damaging the portion of the gate electrode layer 1206 surrounding the channels (i.e., the first semiconductor layer 106) is increased. On the other hand, if the distance D2 is less than 4.5 nm or less than 15 percent of the thickness of the dielectric layer 802, the conductive feature to be formed in the opening 1516 and the gate electrode layer 1206 may not be sufficiently isolated. The removal of the portion 1504 of each gate electrode layer 1206 forms one or more openings 1520 below the isolation region 308, as shown in FIG. 15E. The resulting gate electrode layer 1206 includes the portions 1504 (covered by the liner 1512, thus not visible in FIG. 15E) adjacent one of a pair of S/D epitaxial layer 902, such as the drain epitaxial layer 902, while the portions 1504 adjacent the other of the pair of S/D epitaxial layer 902, such as the source epitaxial layer 902, are removed.

Figures 1, 15F:
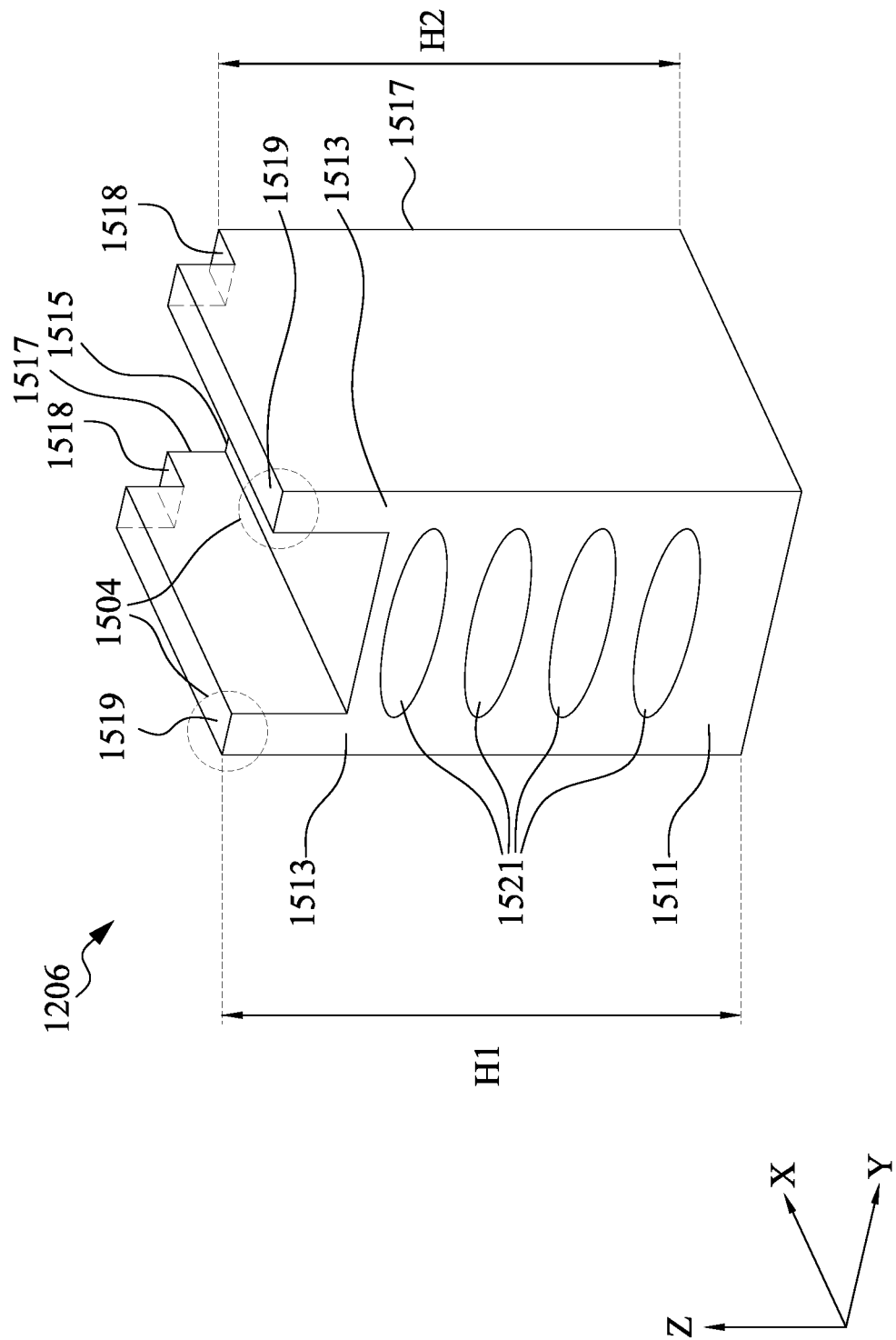
Figures 2, 15F:
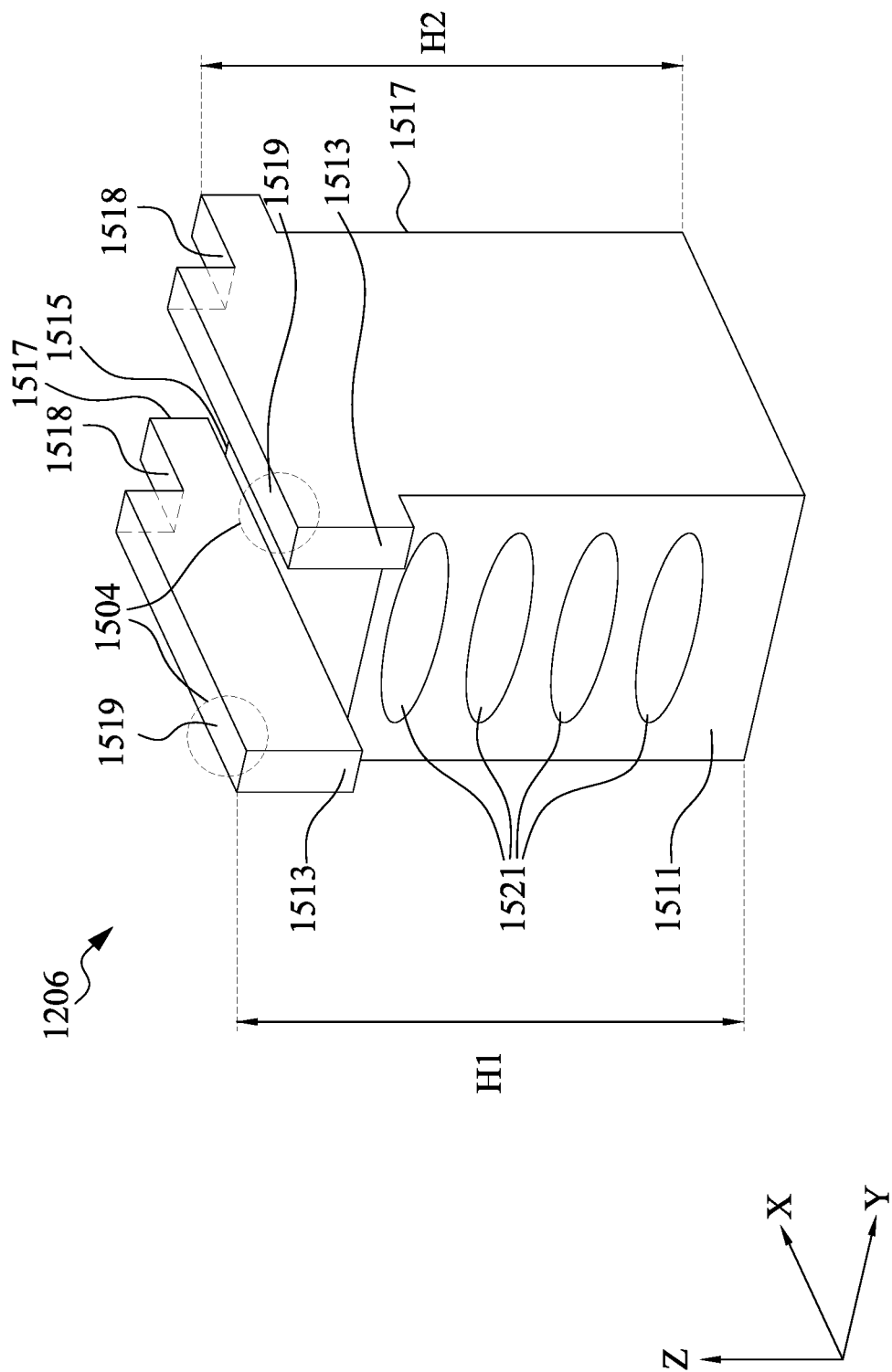

FIGS. 15F-1 and 15F-2 are perspective views of the gate electrode layer 1206 shown in FIG. 15E, in accordance with some embodiments. As shown in FIG. 15F-1, the gate electrode layer 1206 includes a first surface 1511 facing a S/D epitaxial layer, such as a drain epitaxial layer 902 (FIG. 15E). The first surface 1511 may be facing the S/D epitaxial layer 902 located below the dielectric material 1514 (FIG. 15E). A plurality of openings 1521 may be formed in the first surface 1511, and the first semiconductor layers 106 (FIG. 15E) may be located in the openings 1521. The first surface 1511 may include edge portions 1513, and each edge portion 1513 may have a height H1. In one aspect, each edge portion 1513 is connected to a corresponding surface 1519, as shown in FIG. 15F-1. As described above, the surface 1519 extends above the plane defined by the bottom surface 1506 (FIG. 15A) of the dielectric layer 802 (FIG. 15A) (the surface 1519 is located below the plane defined by the bottom surface 1506 of the dielectric layer 802 if the semiconductor device structure 100 is flipped back).

The gate electrode layer 1206 also includes a second surface 1515 opposite the first surface 1511. The second surface 1515 may be facing a S/D epitaxial layer 902, such as a source epitaxial layer 902. In one aspect, the second surface 1515 may be facing the exposed S/D epitaxial layer 902 as shown in FIG. 15E. The second surface 1515 may also include the plurality of openings 1521. The second surface 1515 may include edge portions 1517, and each edge portion 1517 may have a height H2. The height H2 may be less than the height H1 as the result of the removal of the portions 1504 of the gate electrode layer 1206 adjacent the S/D epitaxial layer 902 to be connected to a power rail therebelow. In one aspect, each edge portion 1517 is connected to a corresponding surface 1518, as shown in FIG. 15F-1.

In some embodiments, the first surface 1511 and the second surface 1515 may be planar, as shown in FIG. 15F-1. Thus, the edge portions 1513 and 1517 may be planar. In some embodiments, the first surface 1511 and the second surface 1515 may not be planar, as shown in FIG. 15F-2. A portion of the first surface 1511, such as the portion of the first surface 1511 including the openings 1521, may be recessed compared to a portion of the edge portion 1513. The portion of the edge portion 1513 that protrudes from the recessed portion of the first surface 1511 may be the portion adjacent the dielectric layer 802 (FIG. 15E). Similarly, a portion of the second surface 1515, such as the portion of the second surface 1515 including the openings 1521, may be recessed compared to a portion of the edge portion 1517. The portion of the edge portion 1517 that protrudes from the recessed portion of the second surface 1515 may be the portion adjacent the dielectric layer 802 (FIG. 15E).

Figure 15G:
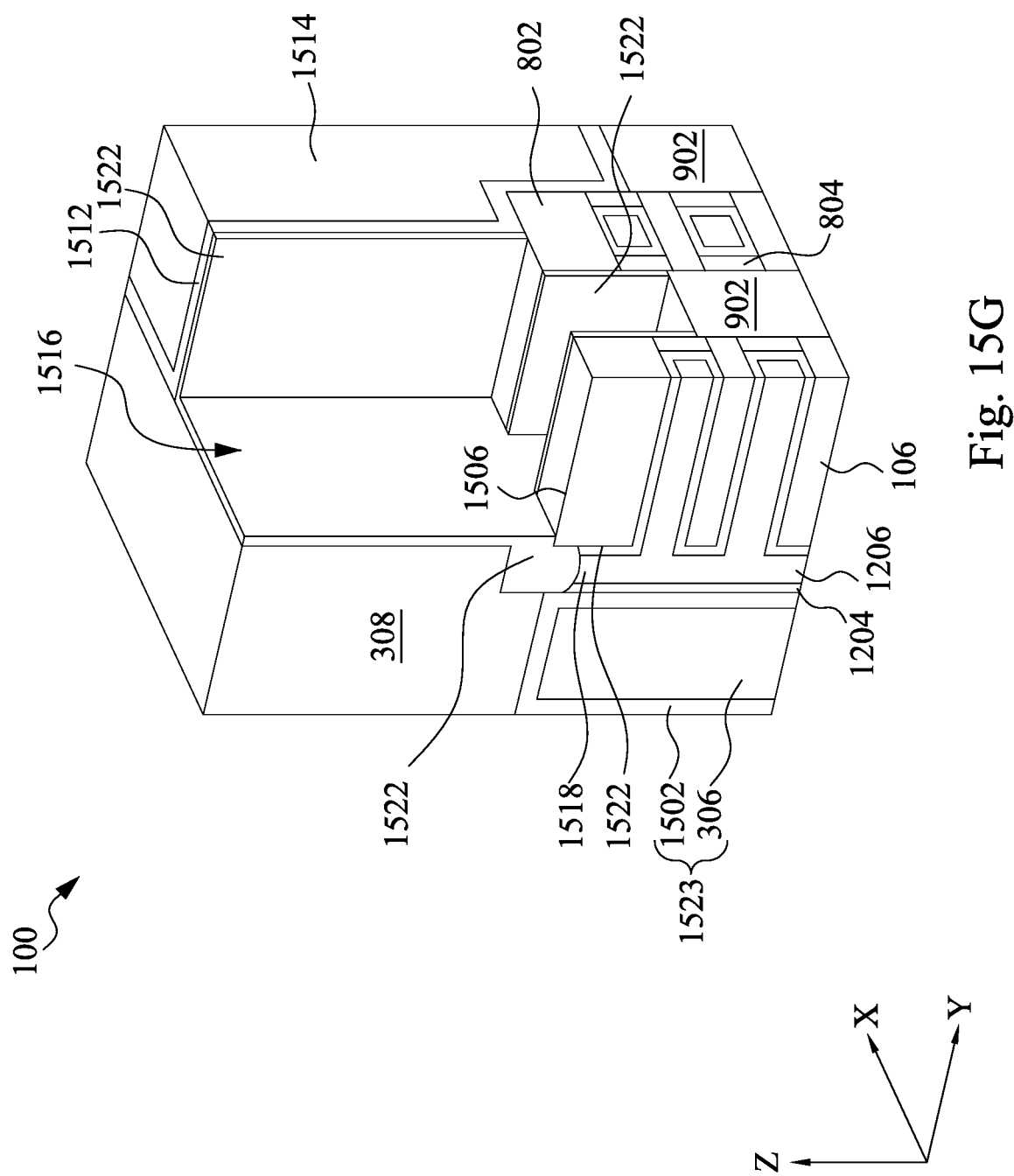

As shown in FIG. 15G, a dielectric material 1522 is formed in the openings 1520 and on the sidewalls of the isolation region 308, the liner 1512, and the dielectric layer 802. The dielectric material 1522 formed in the openings 1520 may be in contact with the liner 1502 of the hybrid fin 1523. The dielectric layer 802 may include a surface 1525 connected to the bottom surface 1506, and the surface 1525 is in contact with both the dielectric material 1522 and the gate dielectric layer 1204, as shown in FIG. 15G. The dielectric material 1522 may be a low-K dielectric material, such as $SiO_2$, SiN, SiCN, SiOC, or SiOCN, or a high-K dielectric material, such as $HfO_2$, ZrOx, $ZrAlO_x$, $HfAlO_x$, $HfSiO_x$, $AlO_x$, or other suitable dielectric material. The dielectric material 1522 may be formed by first forming a conformal layer on the exposed surfaces in the opening 1516, followed by an anisotropic etch process to remove the conformal layer formed on horizontal surfaces in the opening 1516. The conformal layer may be formed on the horizontal surfaces of the isolation region 308 and the dielectric material 1514, which is removed by the anisotropic etch process. Thus, the horizontal surface of the S/D epitaxial layer 902 and a portion of the surface 1506 of each dielectric layer 802 are exposed. In some embodiments, the openings 1520 are partially filled with the dielectric material 1522 with a process that is non-conformal, leaving air gap in the openings 1520. An example of the air gaps 1602 is shown in FIG. 16A.

Figure 15H:
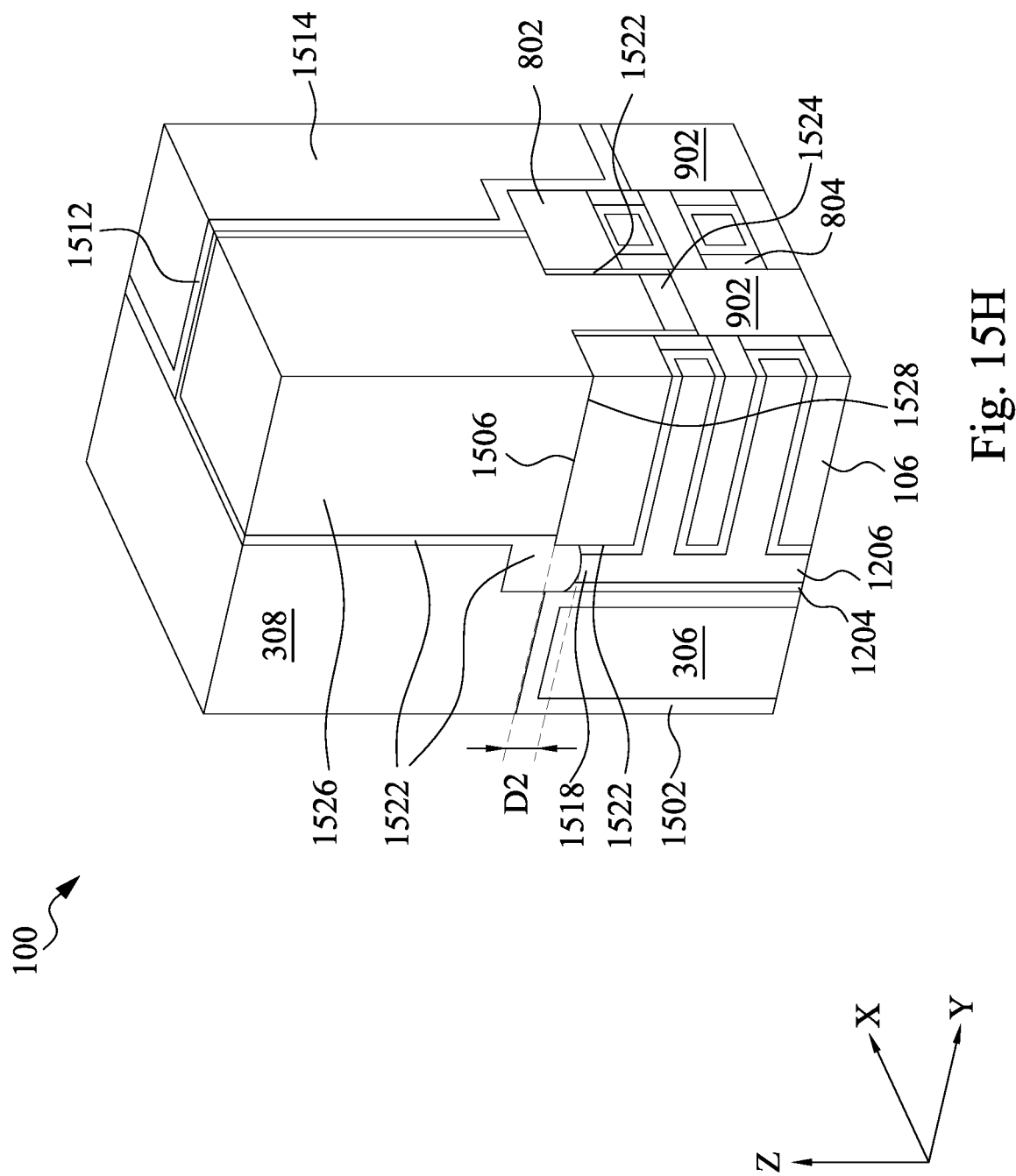

Next, as shown in FIG. 15H, a silicide layer 1524 is selectively formed on the exposed surface of the S/D epitaxial layer 902. The silicide layer 1524 may be made of a material including one or more of WSi, CoSi, NiSi, TiSi, MoSi and TaSi. In some embodiments, the silicide layer 1524 is made of a metal or metal alloy silicide, and the metal includes a noble metal, a refractory metal, a rare earth metal, alloys thereof, or combinations thereof. The silicide layer 1524 may have a thickness ranging from about 1 nm to about 10 nm. A conductive feature 1526 is then formed in the opening 1516 on the silicide layer 1524. The conductive feature 1526 may be made of a metal or metal nitride, such as W, Ru, Co, Cu, Ti, TiN, Ta, TaN, Mo, or Ni. The conductive feature 1526 may be formed by any suitable process, such as PVD or electro-plating. A CMP process may be formed to remove any conductive feature formed on the isolation region 308 and the dielectric material 1514. The conductive feature 1526 has a surface 1528 in contact with a portion of the surface 1506 of the dielectric layer 802. Thus, the surface 1528 of the conductive feature 1526 is vertically separated from the surface 1518 of the gate electrode layer 1206 by the distance D2. In other words, the surface 1518 of the gate electrode layer 1206 is spaced apart from a plane defined by the surface 1528 of the conductive feature 1526 by the distance D2. As shown in FIG. 15H, the conductive feature 1526 includes a first portion 1526A and a second portion 1526B. In some embodiments, the first portion 1526A and the second portion 1526B are a monolithic piece of material that are fabricated by the same deposition process. In some embodiments, the first portion 1526A is deposited first, the second portion 1526B is deposited on the first portion 1526A, and the first portion 1526A may include the same or different material as the second portion 1526B. As shown in FIG. 15H, the first portion 1526A is disposed on the silicide layer 1524, and the second portion 1526B is disposed on the first portion 1526A and the dielectric layers 802. In some embodiments, the first portion 1526A may be a conductive via, and the second portion 1526B may be a conductive via to be connected to a conductive wire. In some embodiments, the second portion 1526B may be a conductive wire.

FIGS. 16A-16C are cross-sectional side views of a portion of the gate electrode layer 1206 and the conductive feature 1526 of FIG. 15H, in accordance with some embodiments. As shown in FIG. 16A, an air gap 1602 is formed between the isolation region 308 and the gate electrode layer 1206. In some embodiments, the air gap 1602 is formed in the dielectric material 1522, as shown in FIG. 16A. The embodiment shown in FIG. 16A is the result of having the trench 304 with the bottom 303 as shown in FIG. 3C. As shown in FIG. 3D, the bottom of the dielectric feature 306 is just below the semiconductor layer 102 (which was subsequently replaced with the dielectric layer 802). Referring to FIG. 16A, after flipping the semiconductor device structure 100, the top of the dielectric feature 306 is extending just above the dielectric layer 802.

The embodiment shown in FIG. 16B is the result of having the trench 304 with the bottom 305 as shown in FIG. 3C. As shown in FIG. 3D, the bottom of the dielectric feature 306 is further below the semiconductor layer 102 (which was subsequently replaced with the dielectric layer 802) than the dielectric feature 306 formed in the trench 304 with the bottom 303. Referring to FIG. 16B, after flipping the semiconductor device structure 100, the top of the dielectric feature 306 is extending further above the dielectric layer 802 than the dielectric feature 306 shown in FIG. 16A. The opening 1520 formed between the isolation region 308 and the gate electrode layer 1206 may be filled with the dielectric material 1522 or with the dielectric material 1522 having air gaps therein.

The embodiment shown in FIG. 16C is the result of having the trench 304 with the bottom 307 as shown in FIG. 3C. As shown in FIG. 3D, the bottom of the dielectric feature 306 is further below the semiconductor layer 102 (which was subsequently replaced with the dielectric layer 802) than the dielectric feature 306 formed in the trench 304 with the bottom 305. Referring to FIG. 16C, after flipping the semiconductor device structure 100, the top of the dielectric feature 306 is extending further above the dielectric layer 802 than the dielectric feature 306 shown in FIG. 16B. The opening 1520 formed between the isolation region 308 and the gate electrode layer 1206 may be filled with the conformal dielectric material 1522 and the conductive feature 1526. In some embodiments, as shown in FIG. 16C, the conductive feature 1526 has a first portion 1604 located between dielectric features 306 and a second portion 1606 located between isolation region 308. The first portion 1604 may be in contact with the dielectric layer 802 and the dielectric material 1522, and the second portion 1606 may be disposed on the first portion 1604. The first portion 1604 has a first width W1, the second width 1606 has a second width W2, and the first width W1 may be greater than the second width W2.

FIGS. 17A-17B are cross-sectional side views of the semiconductor device structure 100, in accordance with some embodiments. As shown in FIGS. 17A and 17B, a power rail 1702 is formed on the conductive feature 1526 and the dielectric material 1514. The power rail 1702 may be made of a conductive material, such as a metal or metal nitride. In some embodiments, the power rail 1702 is made of W, Ru, Co, Cu, Ti, TiN, Ta, TaN, Mo, or Ni. FIGS. 17A and 17B illustrate views of the semiconductor device structure 100 after it has been flipped back. A portion of the interconnecting structure 1402 is shown.

In some embodiments, the power rail 1702 is connected to one or more source epitaxial layer 902, and the silicide layer 1302 and the conductive material 1304 disposed over the source epitaxial layer 902 may or may not be present. Even with the silicide layer 1302 and the conductive material 1304 present, as shown in FIGS. 17A and 17B, the conductive material 1304 is isolated from a conductive feature 1708 by a dielectric material 1704. The dielectric material 1704 may be any suitable material, such as tetraethylorthosilicate (TEOS) oxide, un-doped silicate glass, or doped silicon oxide such as borophosphosilicate glass (BPSG), fused silica glass (FSG), phosphosilicate glass (PSG), or boron doped silicon glass (BSG). The conductive feature 1708 may be a conductive line and may be made of W, Ru, Co, Cu, Ti, TiN, Ta, TaN, Mo, or Ni. In one aspect, the source epitaxial layer 902 receives electrical current from the power rail 1702 disposed therebelow, and the drain epitaxial layer 902 receives electrical current from the conductive feature 1708 disposed thereabove, as shown in FIGS. 17A and 17B. The conductive material 1304 disposed over the drain epitaxial layer 902 is connected to the conductive feature 1708 by a conductive feature 1706. The conductive feature 1706 may be a conductive via and made be made of W, Ru, Co, Cu, Ti, TiN, Ta, TaN, Mo, or Ni. The conductive feature 1706 may have a thickness ranging from about 1 nm to about 50 nm. The drain epitaxial layer 902 is separated from the power rail 1702 by the dielectric material 1514.

The interconnecting structure 1402 includes the conductive features 1708 and a dielectric material 1710 separating the conductive features 1708. The dielectric material 1710 may be made of any suitable dielectric material, such as tetraethylorthosilicate (TEOS) oxide, un-doped silicate glass, or doped silicon oxide such as borophosphosilicate glass (BPSG), fused silica glass (FSG), phosphosilicate glass (PSG), or boron doped silicon glass (BSG).

The present disclosure provides a semiconductor device structure 100 including a device, such as a nanosheet transistor or a FinFET, having the gate electrode layer 1206 that is separated from a plane defined by the surface 1528 of the conductive feature 1526 located below one of a pair of S/D epitaxial layers 902 by a certain distance to avoid electrical short between the gate electrode layer 1206 and the conductive feature 1526. The gate electrode layer 1206 has portions 1504 extending below the surface 1528 of the conductive feature 1526 removed. The S/D epitaxial layer 902 located above the conductive feature 1526 is connected to the power rail 1702 disposed below the conductive feature 1526, and the other of the pair of S/D epitaxial layers 902 is connected to the conductive feature 1708 disposed thereabove. Some embodiments may achieve advantages. For example, the removal of the portions 1504 of the gate electrode layer 1206 can reduce the risk of electrical short between the gate electrode layer 1206 and the conductive feature 1526, leading to reduced TDDB.

An embodiment is a semiconductor device structure. The structure includes a source region, a drain region, and a gate electrode layer disposed between the source region and the drain region. The gate electrode layer includes a first surface facing the source region, and the first surface includes an edge portion having a first height. The gate electrode layer further includes a second surface opposite the first surface and facing the drain region. The second surface includes an edge portion having a second height. The second height is different from the first height.

Another embodiment is a semiconductor device structure. The structure includes a conductive feature, a first sour/drain region disposed over the conductive feature, a dielectric layer including a first surface in contact with the conductive feature and a second surface connected to the first surface, a second source/drain region disposed over a dielectric material, and a gate electrode layer disposed between the first source/drain region and the second source/drain region. The gate electrode layer includes a first surface facing the first source/drain region, and the first surface has a first edge portion. The gate electrode layer further includes a second surface facing the second source/drain region, and the second surface has a second edge portion. The gate electrode layer further includes a third surface connected to the first edge portion of the first surface, and the third surface is located above a plane defined by the first surface of the dielectric layer. The gate electrode layer further includes a fourth surface connected to the second edge portion of the second surface, and the fourth surface is located below the plane defined by the first surface of the dielectric layer.

A further embodiment is a method. The method includes forming a gate electrode layer over a substrate, forming a source region over a substrate, forming a drain region over the substrate, and the gate electrode layer is disposed between the source region and the drain region. The method further includes flipping over the substrate, then removing a first portion of the substrate, then exposing a portion of the gate electrode layer, and then removing the portion of the gate electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
a conductive feature;
a first source/drain region disposed over the conductive feature;
a dielectric layer comprising a first surface in contact with the conductive feature and a second surface connected to the first surface;
a second source/drain region disposed over a first dielectric material;
a gate electrode layer disposed between the first source/drain region and the second source/drain region, wherein the gate electrode layer comprises:
a first surface facing the first source/drain region, wherein the first surface includes a first edge portion;
a second surface facing the second source/drain region, wherein the second surface includes a second edge portion;
a third surface connected to the first edge portion of the first surface, wherein the third surface is located above a plane defined by the first surface of the dielectric layer; and
a fourth surface connected to the second edge portion of the second surface, wherein the fourth surface is located below the plane defined by the first surface of the dielectric layer; and
a plurality of semiconductor layers disposed over the dielectric layer, wherein the gate electrode layer surrounds a portion of each of the plurality of semiconductor layers.

2. The semiconductor device structure of claim 1, wherein the third surface of the gate electrode layer is located above the plane defined by the first surface of the dielectric layer by a distance, and the distance is greater than about 4.5 nm.

3. The semiconductor device structure of claim 1, wherein the third surface of the gate electrode layer is located above the plane defined by the first surface of the dielectric layer by a distance, and the distance is from about 15 percent to about 100 percent of a thickness of the dielectric layer.

4. The semiconductor device structure of claim 3, wherein the thickness of the dielectric layer ranges from about 5 nm to about 30 nm.

5. The semiconductor device structure of claim 1, further comprising a second dielectric material in contact with the third surface of the gate electrode layer, the second surface of the dielectric layer, and the conductive feature.

6. The semiconductor device structure of claim 5, further comprising an air gap formed in the second dielectric material.

7. The semiconductor device structure of claim 1, further comprising a liner in contact with the dielectric layer and the second source/drain region.

8. The semiconductor device structure of claim 7, further comprising a power rail in contact with the conductive feature.

9. A semiconductor device structure, comprising:
a first source/drain epitaxial layer disposed over a power rail;
a second source/drain epitaxial layer disposed over the power rail; and
a gate electrode layer disposed between the first and second source/drain epitaxial layers, wherein the gate electrode layer comprises a conductive material, and wherein the gate electrode layer further comprises:
a first surface facing the first source/drain epitaxial layer, wherein the first surface includes an edge portion having a first height; and
a second surface opposite the first surface and facing the second source/drain epitaxial layer, wherein the second surface includes an edge portion having a second height, wherein the second height is different from the first height.

10. The semiconductor device structure of claim 9, further comprising one or more semiconductor layers disposed between the first and second source/drain epitaxial layers, wherein the gate electrode layer surrounds at least a portion of each of the one or more semiconductor layers.

11. The semiconductor device structure of claim 10, further comprising:
a silicide layer in contact with the first source/drain epitaxial layer; and
a conductive feature in contact with the silicide layer, wherein the conductive feature is in contact with the power rail.

12. The semiconductor device structure of claim 11, further comprising a dielectric material disposed between the second source/drain epitaxial layer and the power rail.

13. A semiconductor device structure, comprising:
a first conductive feature disposed in a first dielectric material;
a first silicide layer disposed on the first conductive feature;
a first source/drain region disposed on the first silicide layer;
a second silicide layer disposed on the first source/drain region;
a second conductive feature disposed on the second silicide layer;
a second source/drain region disposed on the first dielectric material;
a third silicide layer disposed on the second source/drain region;
a third conductive feature disposed on the third silicide layer;
a dielectric layer having a surface in contact with the first conductive feature; and
a gate electrode layer disposed between the first source/drain region and the second source/drain region, wherein the gate electrode layer comprises a surface located above a plane defined by the surface of the dielectric layer.

14. The semiconductor device structure of claim 13, wherein the surface of the gate electrode layer is located above the plane defined by the surface of the dielectric layer by a distance ranging from about 4.5 nm to about 30 nm.

15. The semiconductor device structure of claim 13, wherein the surface of the gate electrode layer is located above the plane defined by the surface of the dielectric layer by a distance, and wherein the distance is about 15 percent to about 100 percent of a thickness of the dielectric layer.

16. The semiconductor device structure of claim 13, further comprising a second dielectric material in contact with the surface of the gate electrode layer, the dielectric layer, and the first conductive feature.

17. The semiconductor device structure of claim 16, further comprising an air gap formed in the second dielectric material.

18. The semiconductor device structure of claim 13, further comprising a plurality of semiconductor layers disposed over the dielectric layer, wherein the gate electrode layer surrounds a portion of each of the plurality of semiconductor layers.

19. The semiconductor device structure of claim 18, further comprising spacers disposed on the plurality of the semiconductor layers, wherein a portion of the gate electrode layer is disposed between the spacers.

20. The semiconductor device structure of claim 13, further comprising a power rail, wherein the first conductive feature is disposed on the power rail.

* * * * *